United States Patent [19]

Cardwell, Jr.

[11] Patent Number: 4,698,653
[45] Date of Patent: Oct. 6, 1987

[54] SEMICONDUCTOR DEVICES CONTROLLED BY DEPLETION REGIONS

[76] Inventor: Walter T. Cardwell, Jr., 217 Bedford Forrest Ave., Anderson, S.C. 29621

[21] Appl. No.: 83,092

[22] Filed: Oct. 9, 1979

[51] Int. Cl.$^4$ .......................................... H01L 29/76
[52] U.S. Cl. .............................. 357/22; 148/DIG. 53; 148/DIG. 88; 357/41; 357/23.15; 437/40; 437/141
[58] Field of Search .................... 357/13, 14, 22, 34, 357/37, 41, 42, 43, 48

[56] References Cited

U.S. PATENT DOCUMENTS

| | | | |
|---|---|---|---|
| 3,223,904 | 12/1965 | Warner, Jr. et al. | 357/22 |
| 3,264,492 | 8/1966 | Gault | 357/22 |
| 3,271,587 | 9/1966 | Schreiner | 357/38 |
| 3,335,342 | 8/1967 | Leistils, Jr. et al. | 357/22 |
| 3,360,698 | 12/1967 | Warner, Jr. et al. | 357/13 |
| 3,398,337 | 8/1968 | So | 357/22 |
| 3,404,295 | 10/1968 | Warner, Jr. | 357/34 |
| 3,414,782 | 12/1968 | Lin et al. | 357/22 |
| 3,472,710 | 10/1969 | Welty | 357/22 |
| 3,506,888 | 4/1970 | Siebertz et al. | 357/14 |
| 3,533,159 | 10/1970 | Hudson, Jr. | 357/22 |
| 3,538,399 | 11/1970 | Bresee et al. | 357/22 |
| 3,564,356 | 2/1971 | Wilson | 357/34 |
| 3,591,840 | 7/1971 | Glinski | 357/22 |
| 3,594,241 | 7/1971 | Bresee | 357/43 |
| 3,701,198 | 10/1972 | Glinski | 357/22 |
| 3,704,399 | 11/1972 | Glaise | 357/13 |
| 3,764,864 | 10/1973 | Okumura et al. | 357/13 |
| 3,794,891 | 2/1974 | Takamiya | 357/14 |
| 3,808,515 | 4/1974 | Davis et al. | 357/14 |
| 3,821,776 | 6/1974 | Hayashi et al. | 357/22 |
| 3,893,147 | 7/1975 | Williams et al. | 357/14 |
| 3,999,207 | 12/1976 | Arai | 357/22 |
| 4,064,525 | 12/1977 | Kano et al. | 357/22 |
| 4,175,240 | 11/1979 | Kremlev et al. | 357/22 |

OTHER PUBLICATIONS

Warner, Jr. and Grung, "Bipolar Lock-Layer Transistor", Solid State Electronics, vol. 18, pp. 323–325, Apr. 1975.

Dissertation Abstracts International, vol. 38, No. 3, Sec. B, Sep. 1977, pp. 1331-B to 1332-B, Abst. of Grung Thesis, "Investigation of Lock-Layer . . . ".

Primary Examiner—William D. Larkins
Attorney, Agent, or Firm—Dorsey & Whitney

[57] ABSTRACT

A field effect transistor is disclosed similar to a junction field effect transistor, but in which the depletion width in the channel due to a PN junction adjoining the channel is controlled not by directly controlling the reverse voltage on the PN junction, but by reverse biasing a second PN junction such that the depletion region from the second PN junction meets the depletion region from the first PN junction (on the side other than the channel side) to thus restrict the width of the depletion regions due to the first PN junction.

115 Claims, 83 Drawing Figures

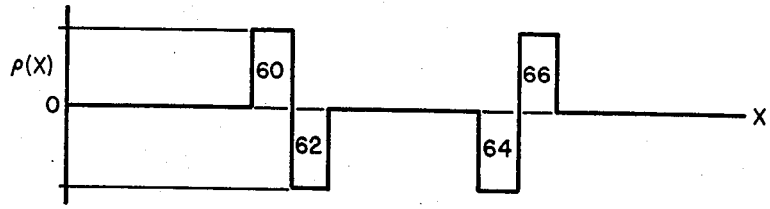
FIG. 2A
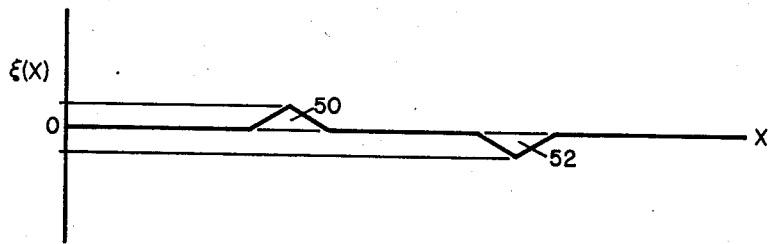
FIG. 2B
FIG. 2C
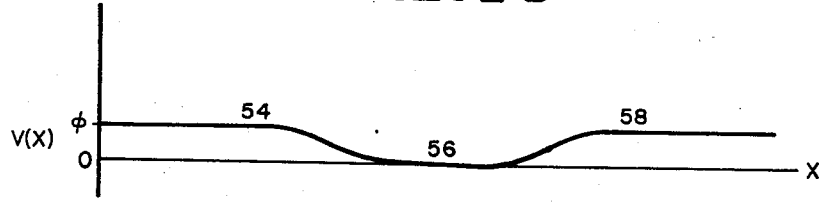
FIG. 2D
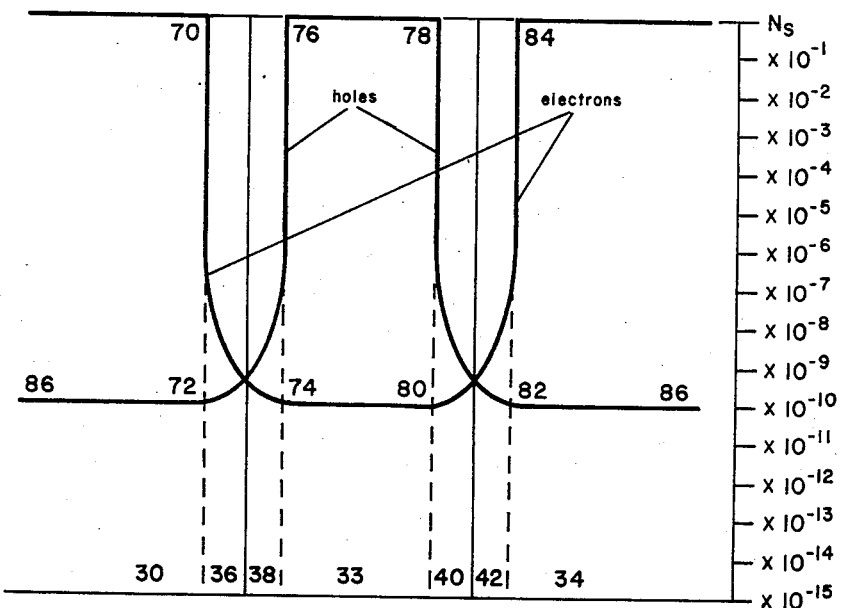
FIG. 2E

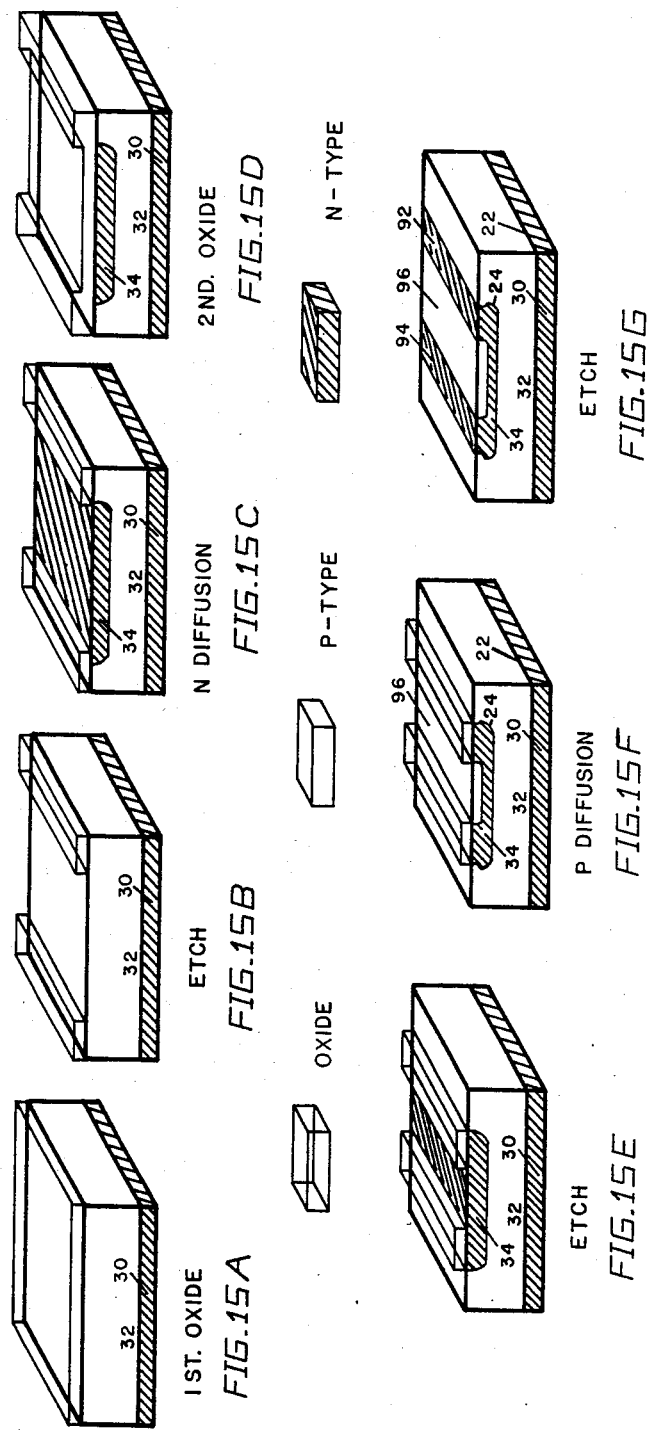

SEMICONDUCTOR DEVICES CONTROLLED BY DEPLETION REGIONS

BACKGROUND OF THE INVENTION

The field of the invention is semiconductor devices and particularly junction field-effect devices such as junction field-effect transistors.

Modification of basic junction field-effect devices to improve performance and increase their applicability to integrated circuits has been an area of active investigation. However, in all junction field-effect devices of the past, gate control of the transistor has been provided by using a semiconductor material having an impurity concentration which is opposite to that which has been utilized for the drain and source electrodes and consequently the channel. This has required that the gate material be isolated from the surrounding substrate if it is to be useful in integrated circuits. In addition, it has prevented enhancement mode junction field-effect transistors from being constructed; that is, a device whose channel current is zero with the gate and source electrodes connected together. Devices of the past have been controlled by changes in the applied potential across the junction. It is not believed that any prior art device has been disclosed or suggested in which merged depletion regions are used for isolation and which is operated and controlled by merging depletion regions or otherwise affecting the charge balance across the channel junction. Nor is any prior art device known which has all connections formed of the same conductivity type material with no intervening isolating regions.

BRIEF SUMMARY OF THE INVENTION

The invention incorporates the application of two new methods for operating semiconductor devices, merged depletion regions and charge balance control. These two methods can be used for many new semiconductor devices and combined to yield a new type of junction field-effect transistor that can be manufactured in integrated form without the use of any isolation regions. The invention is better suited to integrated circuits than any other device because all connections can be formed of the same conductivity type material. No metal contacts, electrodes or interconnections are required to create integrated circuitry, which permits the construction of true three-dimensional circuits. The lack of the need for metal interconnects makes the invention suitable to create denser forms of logic than are known today.

Using the invention, a semiconductor device can be constructed in a configuration which is similar to a conventional junction field-effect transistor in that it employs a drain electrode and source electrode connected by a channel of one conductivity type. However, the material surrounding the channel forms a substrate instead of the gate of the device. A gate region of the same conductivity type material as the channel is placed near enough to the channel so that when the gate to substrate junction is reverse biased, the gate depletion region merges with the channel depletion region in the substrate. Gate control of the channel depletion region in the channel is accomplished by altering the channel junction depletion region in the substrate. Using the method of charge balance depletion region width control, the gate control of the channel depletion region in the substrate is reflected in the depletion region in the channel. Consequently, the gate controls the channel current in a manner similar to a conventional junction field-effect transistor. It also permits the device to be operated in an enhancement mode where, since the gate and channel are isolated, the drain and source are biased with respect to the substrate to turn off the device while the gate to substrate bias is used to turn on the device. This is possible because the gate electrode is isolated from the channel by the merged depletion region.

As a discrete device, the junction field-effect transistor controlled by merged depletion regions is characterized by lower noise and lower feedback capacitance than any other type of device and, with a submicrometer channel length obtained in a vertical structure, a cutoff frequency well above all other known transistor types is obtained. Because the gate is separated from the channel, high-voltage operation is possible while the self-ballasting nature of field-effect devices permits large-area high-current devices to be constructed. As in the integrated form, the separation of the gate and channel permits operation of the device in an enhancement mode and by changing the gate to channel spacing or the impurity concentrations, the threshold voltage can be changed. Properly constructed, one embodiment of the device, referred to as a linear device, has as low or lower distortion than any other device and should have no change in threshold voltage with temperature. A second embodiment of the device, referred to as a quadratic device, has lower threshold voltage variations with temperature than other devices while its distortion is comparable to other junction field-effect transistors. In addition, both versions are as radiation resistant and as rugged as other junction field-effect devices.

BRIEF DESCRIPTION OF THE DRAWINGS

FIG. 1, comprising

FIG. 2, comprising FIGS. 2a–2e, represents the depletion region widths, charge density, $\xi$ field, potential, and free-carrier concentrations of two unbiased P-N junctions in one dimension;

FIG. 3, comprising

FIG. 4, comprising

FIG. 5, comprising

FIG. 6, comprising

FIG. 7, comprising FIGS. 7a–7e, represents the depletion region widths, charge density, $\xi$ field, potential, and free-carrier concentrations of two reverse-biased P-N junctions in one dimension at punch-through;

FIG. 8, comprising

FIG. 15, comprising FIGS. 15a–15g, diagrammatically illustrates the steps used to manufacture the test device shown in FIG. 9;

DETAILED DESCRIPTION OF THE PREFERRED EMBODIMENTS

Figure 1A:
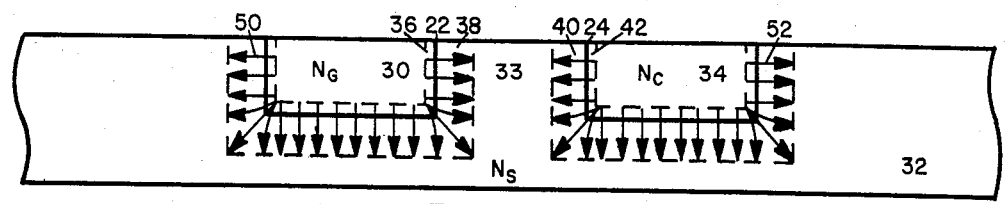
FIGS. 1a–1e, represents the $\xi$ fields of two reversed biased junctions in two dimensions with various biases applied.

For purposes of illustration and description the method of operating a semiconductor device by merging depletion regions in the substrate of the device is first discussed followed by a description of the method of operating a semiconductor device by charge balance depletion region width control, that is, altering the depletion region on one side of a junction and using the charge balance across the junction to control the width of the depletion region on the other side of the junction. A discrete device is disclosed, a junction field-effect transistor having all connections, gate, source and drain, of the same conductivity type material with a substrate of opposite conductivity type material. New insights into the channel operation of such a device are presented. Depletion region width control in the channel is achieved by charge balance and the depletion region in the substrate associated with the channel junction is altered by merging the gate junction depletion region in the substrate with the channel junction depletion region in the substrate.

Throughout the Disclosure the following subscripts are used for purposes of illustration of the relationship between the various sections: c (channel), g (gate), and s (substrate). However, it is not intended that such subscripts should limit the invention as claimed. Similarly, semiconductor regions and depletion regions and the like which are functionally similar or which can be put to complementary uses are uniformly designated by numbers assigned to each to assist in the association and assimilation of the description of the preferred embodiments and the drawings. Again, this is not meant to limit the invention but, instead, to enable others to apply and use the invention in configurations not specifically disclosed in this description but which are within the scope and intendment of the claims to the invention.

The term "substrate" as used in the Disclosure refers to the bulk semiconductor material surrounding or between regions of semiconductor material of a different conductivity type. In other words, the substrate is the bulk semiconductor material through which external current does not normally flow. For example, if a prefabricated chip is used with an N type substrate layer upon which is grown a P type epitaxial layer and N type regions are diffused into the P type layer and the N type layer and N regions are used for external connections such as the gate, source, drain and channel of a JFET, the P type epitaxial layer is defined as and referred to as the "substrate" for the purposes of this Disclosure. By semiconductor material of a different or opposite conductivity type is meant N type or P type for intrinsic material, P type or intrinsic for N type material and N type or intrinsic for P type material. Therefore, while the discussion is mainly directed to devices having N and P type material this is because of the extent of its present use and is not meant to exclude devices which may be fabricated using intrinsic materials.

Also, while this Disclosure is primarily directed to a junction field-effect device controlled by merged depletion regions, from a review of the Disclosure it should be readily apparent that there are many varied applications of merged depletion regions and charge balance depletion region width control alone or together and that the invention is much broader than just a discrete field-effect transistor and that the emphasis placed on a junction field-effect transistor is due to the widespread use of the junction field-effect transistor and the fact that it readily demonstrates the special characteristics of the invention and is therefore an illustration of a preferred embodiment of the invention.

MERGED DEPLETION REGIONS

In conventional devices, particularly the junction field-effect transistor (JFET), depletion regions have been merged in the channel of a JFET to pinch off the channel. However, until now, the merging of depletion regions other than in the channel of a JFET, has been something to avoid due to the high currents that result when the regions merge, known as "punch through". In most cases this occurred inadvertently in devices where one junction was heavily reverse biased while the other was either unbiased or forward biased. The only consideration given to merged depletion regions made use of the high currents obtained when one junction depletion region punched through to the other depletion region with the resulting high current. Punch through has been used for MOS input protection and as a non-critical voltage regulator. One embodiment of this invention uses merged depletion regions as a method of controlling operation of semiconductor devices which results in new and unique structures, devices, and applications.

The most important characteristic of any device or structure is the relationship between the currents in the device to the internal and applied external potentials. The characteristics of two reverse-biased P-N junctions when their depletion regions merge can be obtained by considering a two-dimensional model of the depletion regions. A qualitative analysis of the two-dimensional case can be illustrated which allows a one-dimensional quantitative analysis to be applied over certain selected areas of the depletion regions.

FIG. 1 shows in simplified form two P-N junctions 22, 24 formed by two N regions 30, 34 embedded in a P-type material 32 substrate and their associated $\xi$ fields 50, 52 and depletion regions 36, 38, 40, 42. FIG. 1a shows the case where both junctions 22, 24 are unbiased with depletion regions 36, 38, 40, 42 caused by the contact potential. FIG. 1b shows the left junction 22 unbiased and the right junction 24 reverse biased until the depletion regions 38, 40 in the substrate 32 just merge. FIG. 1c shows both junctions 22, 24 reverse biased equally until the depletion regions 38, 40 in the substrate 32 again just begin to merge. FIG. 1d shows the bias to the two junctions 22, 24 increased over that shown in FIG. 1c but again with both junctions 22, 24 biases equal. FIG. 1e shows the case where one junction 24 is reverse biased more than the other 22 and if the bias is increased until the depletion region width 38 is slightly less than the depletion region width 38 shown in FIG. 1b, punch through to the other junction 22 will result.

The following simplifying assumptions are made for the analysis of these junctions. The bulk material 32 is relatively lightly doped P material. The two N regions 30, 34 form two abrupt junctions 22, 24 and have equal doping which is greater than the P region 32. All regions 30, 32, 34 are assumed to have uniform doping. Because of the uniform doping, there will be no $\xi$ field 50, 52 outside of the depletion regions 36, 38, 40, 42. The P region 32 is held at ground potential and all potentials are referenced to it. Overall charge balance, to be described below, holds across all junctions 22, 24. Finally, the depletion regions 36, 42 spreading into the N regions 30, 34 will not completely deplete these regions 30, 34.

In FIG. 1a the electric field (hereinaffer $\xi$ field) 50, 52 is shown across the P-N junctions 22, 24. As with any P-N junction, the junction can be considered to be a capacitor with the plates formed by the undepleted N and P regions 31, 33, 35 with the depletion regions 36, 38, and 40, 42 forming the dielectric. With the P-N junction characterized by the depletion approximation, no free carriers in the depletion regions, the concept of the P-N junction capacitor is fairly accurate. The undepleted N and P regions 31, 33, 35 do contain free-charge carriers and can thus be considered to be conductors. As conductors, they can have no $\xi$ field within them; thus the $\xi$ fields 50, 52 across the depletion regions 36, 38, 40, 42 are always perpendicular to the edges of the depletion regions. Also with no current flowing, the potential along the edge of any depletion region must be constant due to the lack of any $\xi$ field along the edge. In FIG. 1a the two depletion regions 38, 40 do not merge; thus the P region 33 between the depletion regions 38, 40 is an extension of the rest of the P region 32 and, acting as a conductor, it must be at ground potential.

Figure 1B:
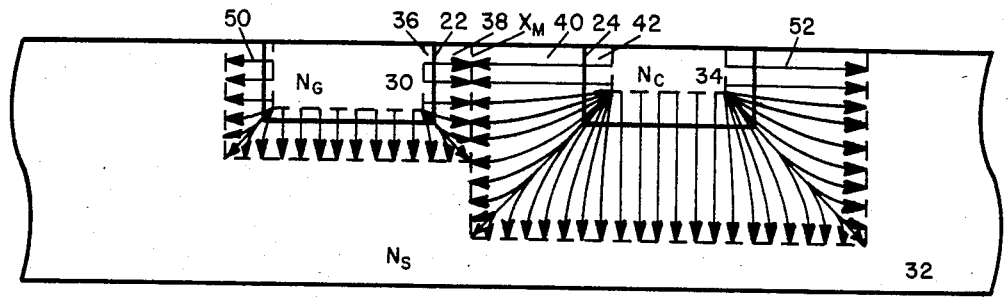
Figure 1C:
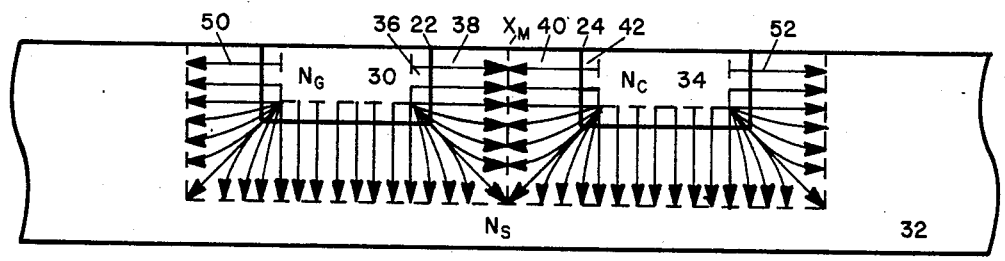

In FIG. 1b the potential of the right junction 24 is increased and the depletion region 40 in the P region 32 of that junction 24 merges with the depletion region 38 in the P region 32 of the second junction 22; thus there is no longer a P region 33 between the two free-charge carriers to form a conductor. This permits the potential between the two depletion regions 38, 40 to rise above ground potential if necessary. In FIG. 1b the two depletion regions 38, 40 have just merged so that the point where they meet is still at ground potential. The same is true for FIG. 1c except that both junctions 22, 24 are equally reverse biased with the depletion regions 38, 40 just merging. In FIGS. 1b and 1c the potential at the junction of the two depletion regions 38, 40, at $X_m$, is at ground potential even though the region is not part of the grounded P substrate 32. This is due to the fact that integrating along the $\epsilon$ field results in a potential that is equal to the applied reverse-bias voltage.

Figure 1D:
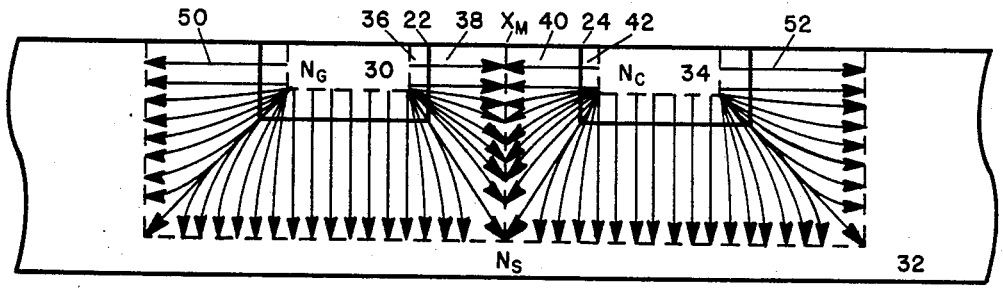
Figure 1E:
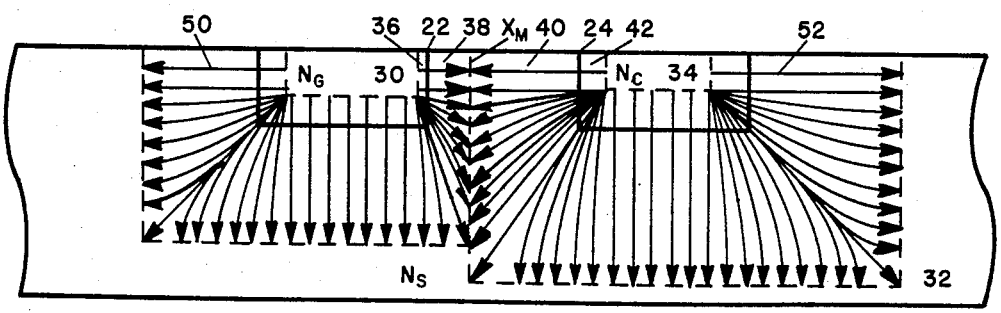
Figure 3A:
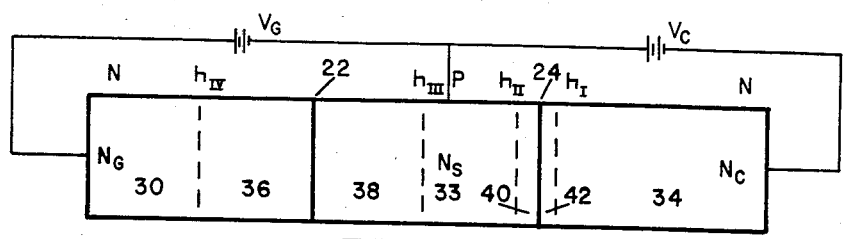
FIGS. 3a–3e, represents the depletion region widths, charge density, $\xi$ field, potential, and free-carrier concentrations of one forward-biased and one reverse-biased P-N junction in one dimension.
Figure 3B:
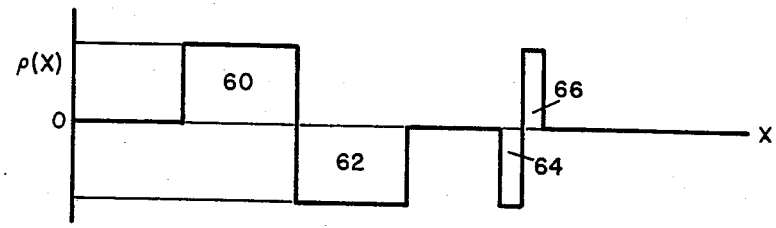
Figure 3C:
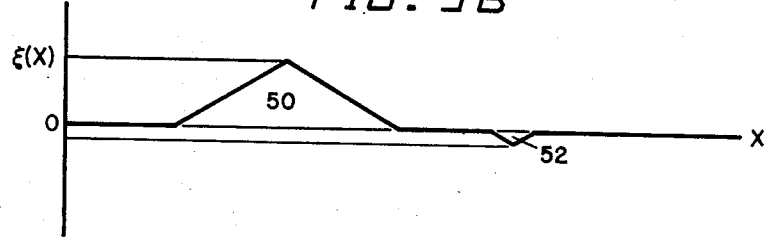
Figure 3D:
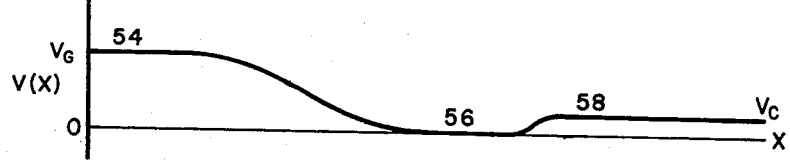
Figure 3E:
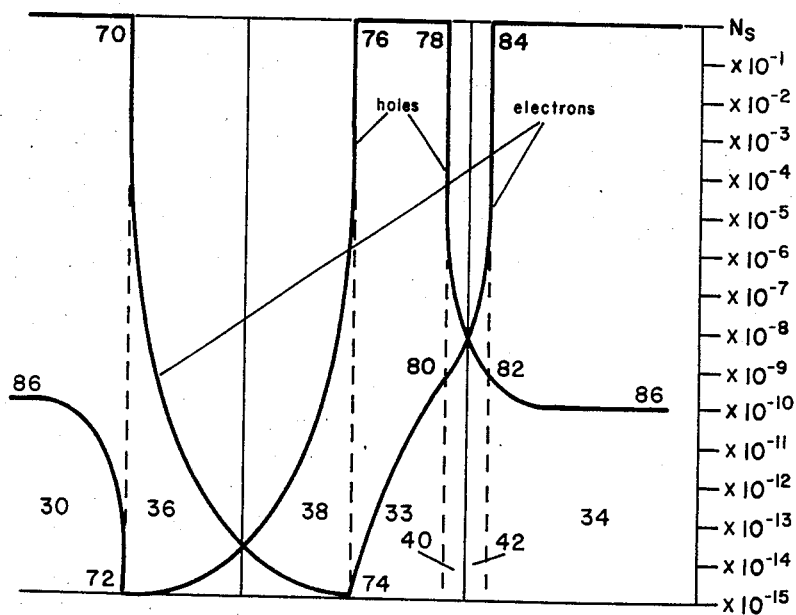
Figure 4A:
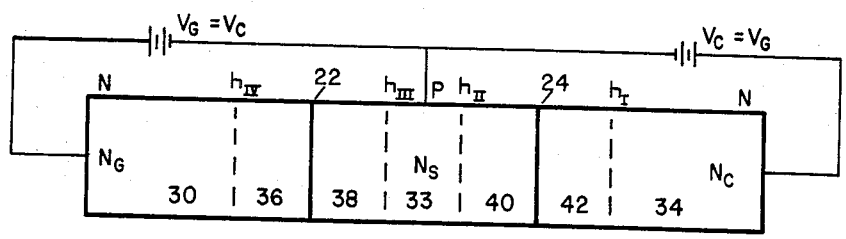
FIGS. 4a–4e, represents the depletion region widths, charge density, $\xi$ field, potential, and free-carrier concentrations of two reverse-biased P-N junctions with equal biases applied.
Figure 4B:
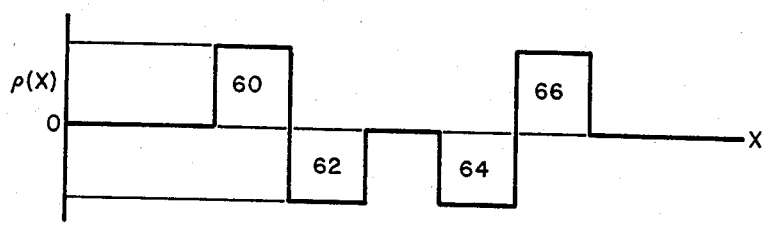
Figure 4C:
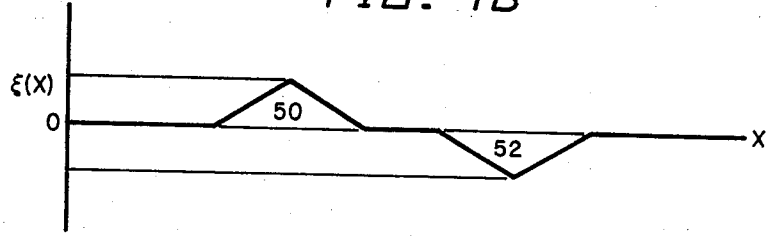
Figure 4D:
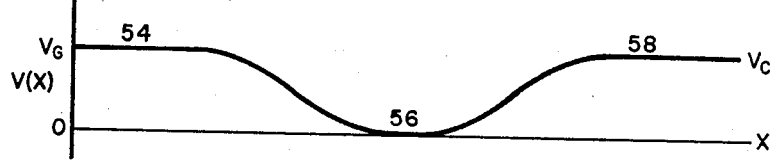
Figure 4E:
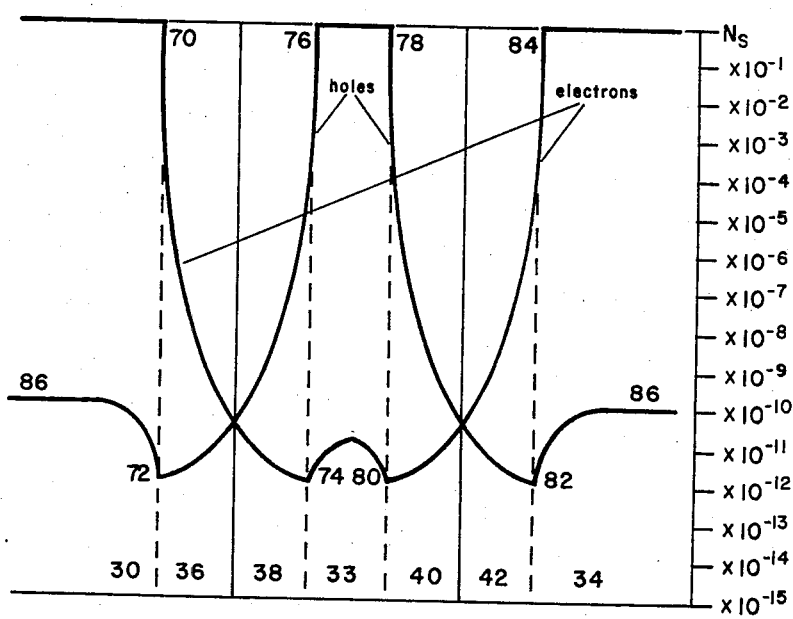
Figure 5A:
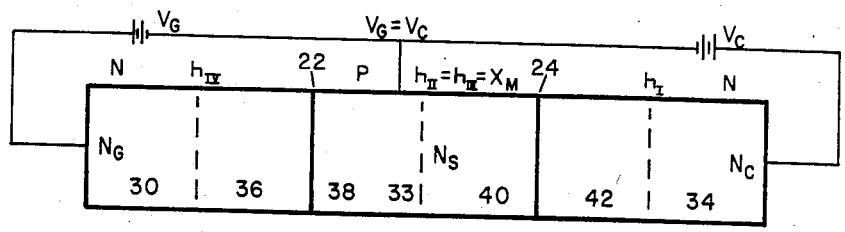
FIGS. 5a–5e, represents the depletion region widths, charge density, $\xi$ field, potential, and free-carrier concentrations of two reverse-biased P-N junctions in one dimension with equal biases and merged depletion regions.
Figure 5B:
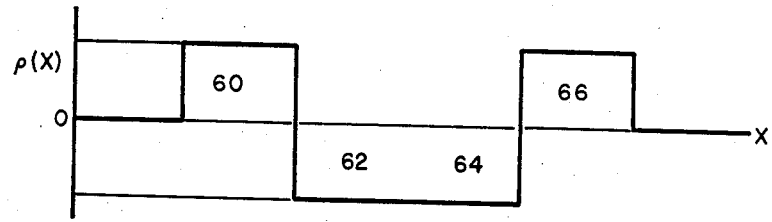
Figure 5C:
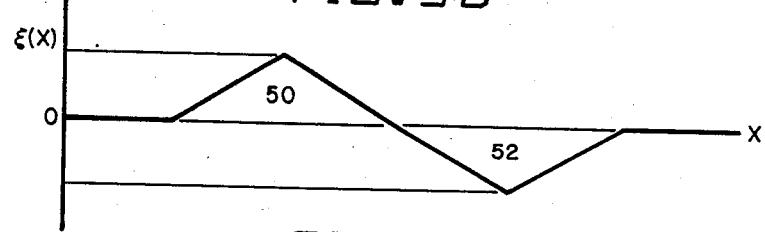
Figure 5D:
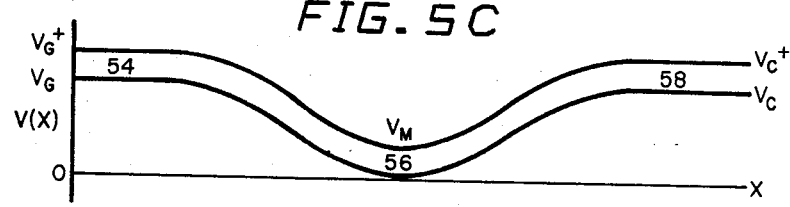
Figure 5E:
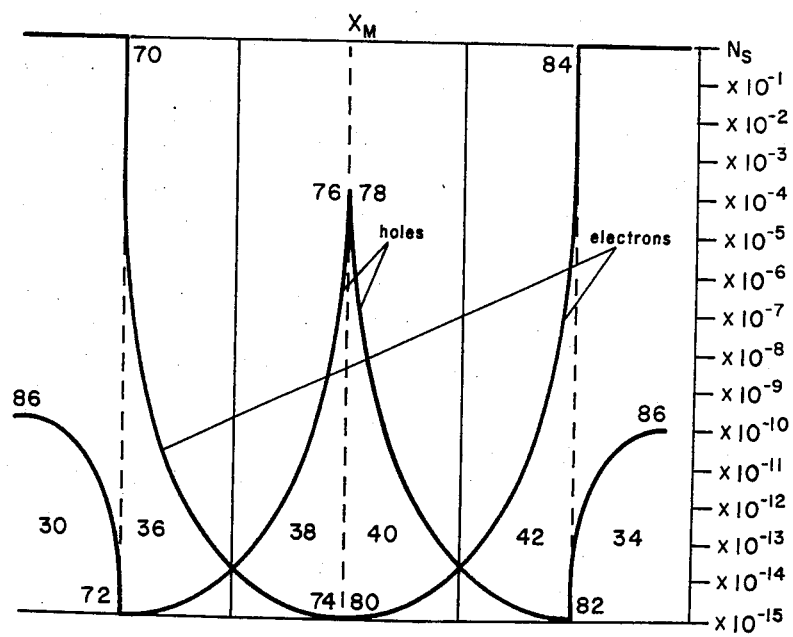
Figure 6A:
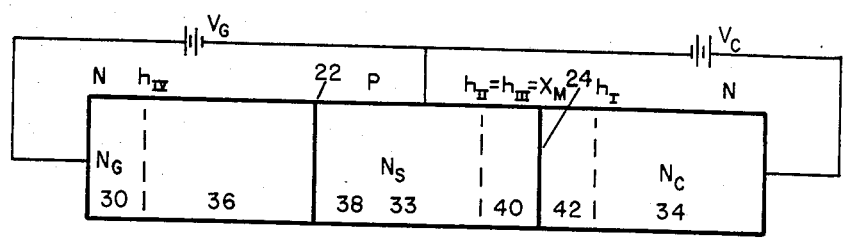
FIGS. 6a–6e, represents the depletion region widths, charge density, $\xi$ field, potential, and free-carrier coonconcentrations of two reverse-biased P-N junctions in one dimension with unequal biases and merged depletion regions.
Figure 6B:
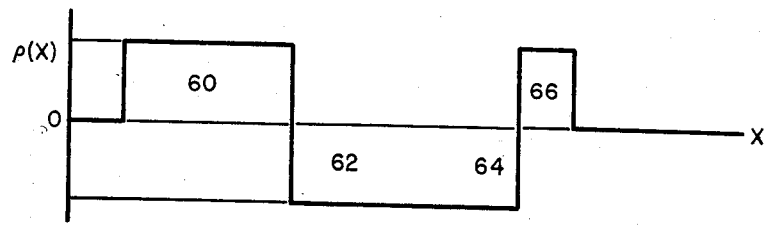
Figure 6C:
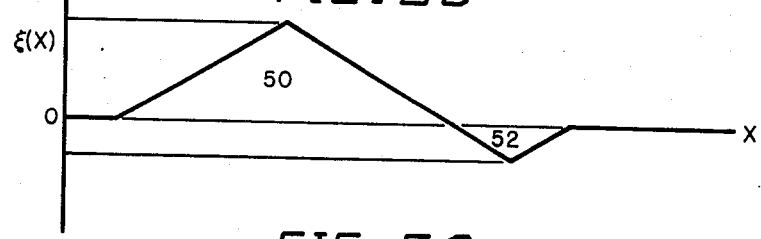
Figure 6D:
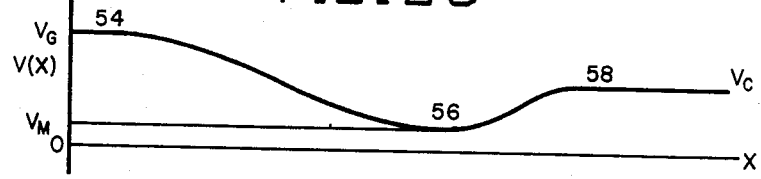
Figure 6E:
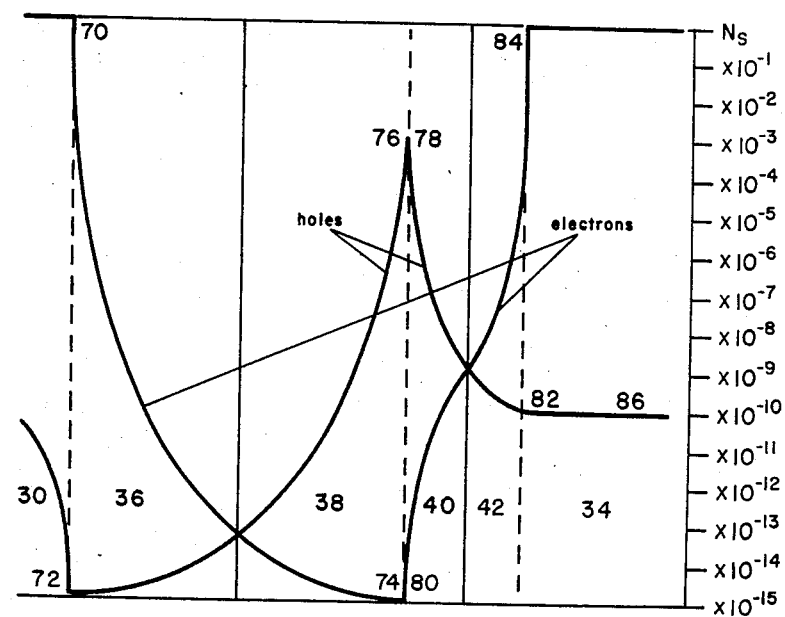
Figure 7A:
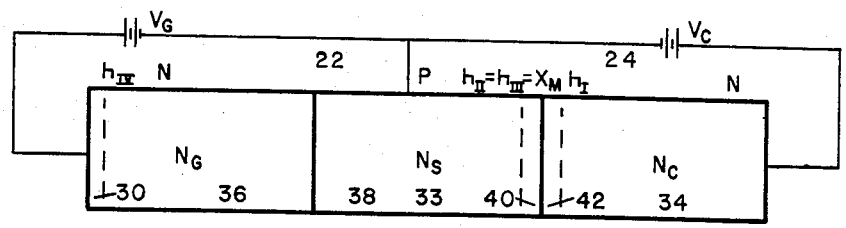
Figure 7B:
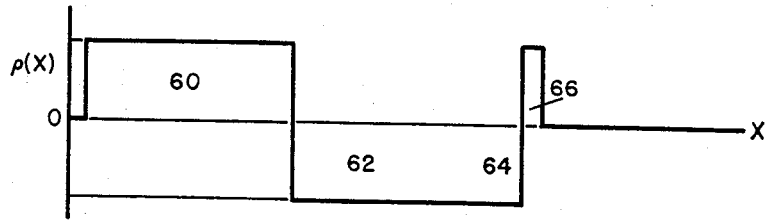
Figure 7C:
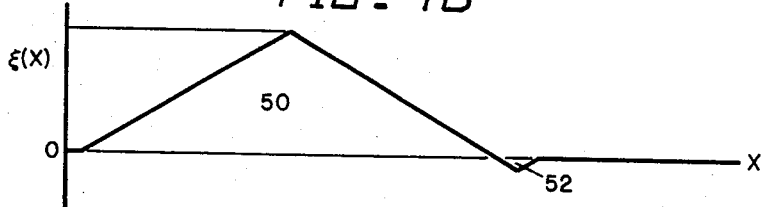
Figure 7D:
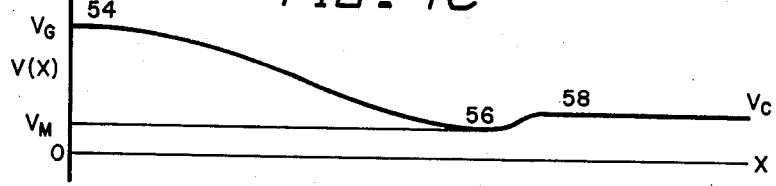
Figure 7E:
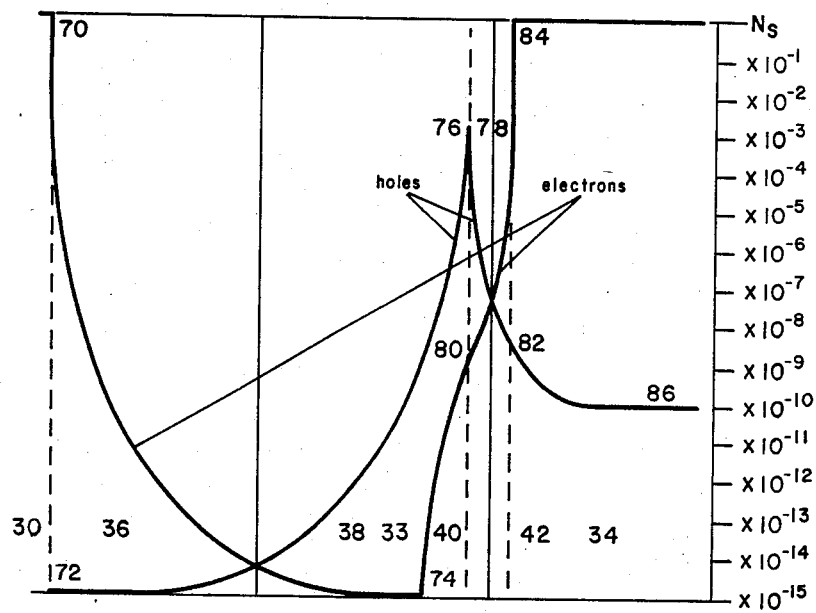

In FIGS. 1d and 1e the situation changes. The change in $\xi$ field 50, 52 across the depletion region 38, 40 is caused by the fixed charges and is thus a function of the doping level. When the two regions 38, 40 merge, there is no longer any more charge available to change the $\xi$ field 50, 52. For the $\xi$ field 50, 52 to support a greater voltage either the depletion region width 38, 40 must increase or the charge in the depletion region 38, 40 must increase. In the merged depletion region 38 and 40 it can do neither and due to charge balance across the junction, discussed below, the depletion regions 36, 42 cannot extend on the N side of the junction 22, 24 either since there are no holes left in the P side 33 with which to combine.

In FIGS. 1d and 1e the reverse bias has been increased beyond the point that the $\xi$ field 50, 52 between the two junctions 22, 24 can support. What now occurs is that the potential Vm, where the two depletion regions 38, 40 merge, Xm, is no longer at ground potential. The shape of the $\xi$ field 50, 52 is fixed by the requirement that it must be perpendicular to the depletion region 36, 38, 40, 42 edges. This forces the $\xi$ field 50, 52 to bend at some point between the two depletion regions 38, 40; thus containing a component in the vertical direction which will support the increase in potential where the two regions 38, 40 merge. In all cases the $\xi$ field 50, 52 must be perpendicular to the edges of all the depletion regions 36, 38, 40, 42 except where they merge and in addition the $\xi$ field must be zero outside of it.

This also indicates another fundamental property of the $\xi$ field 50, 52 when the two depletion regions 38, 40 are merged and allows the assignment of portions of that merged depletion region, 38 and 40, to each junction 22, 24. The component of the $\xi$ field 50, 52 in the horizontal direction between the two junctions 22, 24 reverses direction at some point between the junctions 22, 24 and at this point of reversal the $\xi$ field must be zero. This will be the point that separates the two depletion regions 38, 40 and at the same time will be the lowest potential along a line between the two junctions 22, 24.

It is necessary to examine the depletion regions 36, 38, 40, 42 in two dimensions to show the ground reference to which the junction biases are measured. If this were not done, there would be no reason for the $\xi$ field 50, 52 to reverse itself somewhere between the two junctions 22, 24. If it is kept in mind that the $\xi$ field 50, 52 must point toward ground between the junctions 22, 24, it is possible to consider only the horizontal component of the $\xi$ field 50, 52 between the junctions 22, 24 and ignore the vertical component with no loss of accuracy. In areas with no vertical component a one-dimensional analysis will yield quantitative results. In areas where there is a vertical component some of the charge that could be used to support the horizontal component must now be used to support the vertical component. For a one-dimensional approximation the error introduced can be compensated for by considering that the doping level is less than the actual value The previous discussion gives no information about the currents in the merged depletion regions 38, 40 and the relationshiop between these currents and the applied biases. This can be obtained by examining a one-dimensional structure as shown in FIGS. 2 through 7. These figures show a one-dimensional plot of the depletion regions 36, 38, 40, 42, and charge distributions 60, 62, 64, 66 in each depletion region, the $\xi$ field 50, 52, and potentials 54, 56, 58 associated with each junction 22, 24, and free-carrier concentrations 70, 72, 74, 76, 78, 80, 82, 84, 86 under various applied biases. The diagrams deal primarily with the area between the two junctions 22, 24 where the depletion regions 38, 40 exist and it is assumed that no vertical component of the $\xi$ field 50, 52 exists. In this series of figures the N and P regions 30, 32, 34 are all equally doped with uniform impurity concentrations that form abrupt junctions 22, 24. In all cases overall charge balance must hold; thus the quantity of charge 60 contained within the depletion region 36 must equal the charge 62 across the junction 22 in the P depletion region 38. Similarly, the total charge 64 in depletion region 40 must equal the total charge 66 in depletion region 42.

In normal P-N junctions two currents exist across each junction, a drift current caused by the free-carriers that enter the $\xi$ field across the junction which is opposed by a diffusion current caused by the carrier concentration gradients across the junction. As long as these two currents are balanced, no net current will flow across the junction and through the external circuit. A current can be made to flow through the external circuit by using an applied potential across the junction to alter the minority carrier concentrations at the edges of the depletion regions. Under forward bias as shown in FIG. 3, the minority carriers 82 in the right hand N region 34, holes, are above the equilibrium hole concentration 86 which results in a diffusion current away from the edge of the depletion region. Under reverse bias as illustrated by the left hand junction 22 in FIG. 3, the hole concentration 72 is less than the equilibrium concentration 86 and a diffusion current toward the junction 22 results. A diffusion current exists wherever there is a concentration gradient and flows from the region of high concentration to one of lower concentration. Because the diffusion current is equal to the carrier gradient, $\Delta N/\Delta \chi$, for a given diffusion length, $\Delta \chi$, the change in concentration, $\Delta N$, can be made orders of magnitude greater under forward bias than it can be reduced under reverse bias. For the case illustrated in FIG. 3 using silicon at room temperature as an example, the doping level is approximately $10^{15}$ A/cm$^3$ giving an equilibrium minority carrier concentration of $10^5$ (Ne$\times$Np$\simeq 10^{20}$). For the forward biased case, $\Delta N$ (82-86) is approximately $10^7$ A/cm$^3$ while for the reverse biased junction, $\Delta N$ (86-72) is approximately $10^5$ A/cm$^3$. While the forward bias can be increased to alter the minority concentration to almost the majority level on the other side of the junction, an increase in reverse bias will not cause a further decrease in the minority level 72 since it already approaches zero. Whether a junction is forward or reverse biased can be determined by examining the minority carrier concentrations at the edge of the depletion regions. If the concentrations are below the equilibrium value the junction is reverse biased while if they are above the equilibrium level the junction is forward biased. If the concentration is equal to the equilibrium value, the junction is unbiased.

In FIG. 2, both junctions 22, 24 are unbiased since the minority carrier concentrations at the edges of the depletion regions 72, 74, 80, 82 are all equal to the equilibrium value 86. In FIG. 3, the left junction 22 is reverse biased while the right junction 24 is forward biased. If the right junction 24 is separated from the left 22 by a sufficient distance as shown in FIG. 3, the minority carrier concentration 80 has decayed to its equilibrium level before reaching the edge of the left junction's P depletion region 38; thus few carriers are collected by the reverse biased junction 24. If the junctions 22, 24 are close enough so that the minority carrier concentration is still above equilibrium near the edge of the reverse-biased depletion region then the structure shown is that of a conventional bipolar transistor with the left junction 22 the collector and the right junction 24 the emitter. In FIG. 4 both junctions 22, 24 are reverse biased and because the carrier concentration gradient at 74, 80 is less than for a single junction, only small leakage currents will flow. It is important to note that normally there will be two components of this diffusion leakage current. One component will be between the two N regions 36, 42 and the other will be between the N regions 36, 42 and the P regions 38, 40. In FIG. 4 there will be no leakage current between the two N regions 36, 42 since they are at the same potential.

In FIGS. 2 through 4 the P-region depletion regions 38, 40 are not merged. In FIG. 5 the two P-region depletion regions 38, 40 do merge due to the increased bias applied equally to both junctions 22, 24. The minority carrier concentrations 72, 74, 80, 82 are all below the equilibrium value 86 thus both junctions 22, 24 are reverse biased and only reverse leakage currents flow. It is impossible from this description to determine exactly what the majority carrier concentrations 76, 78 in the P-region 32 will be but it will probably be reduced below the unmerged level, Ns; thus the hole reverse leakage diffusion current should be reduced below the unmerged levels. In any case, it will not be greater. It is also necessary that the concentrations 76 and 78 equal each other since the two junctions have equal reverse biases. As in FIG. 4, there will be no leakage current between the two depleted N regions 36, 42.

The second set of bias values, Vg+ and Vc+, illustrate what occurs when the bias is further increased after the regions 38, 40 have merged. Since there is no further change between the two junctions 22, 24 to support the increased potential, it appears as an increase in the potential Vm at point Xm where the two depletion regions 38, 40 merge. In one dimension, there are no other changes in depletion regions, fixed charge, $\xi$ field, or carrier concentrations over the case where the regions 38, 40 have just begun to merge.

In FIG. 6 both junctions 22, 24 have a reverse bias applied but in this case the bias to the left junction 22 has been increased until it is far enough above the bias of the right hand junction 24 so that the depletion region 40 width is equal to its unbiased value. Although only true to a first approximation due to the decrease in diffusion length of the carriers, there again will only be leakage currents across the junctions 22, 24. This time, however, there will be a component of electron diffusion current between the two N regions 36, 34 due to the higher carrier concentration gradient to the left, 84-80 over that to the right 70-74.

A second way of looking at what has occurred in FIG. 6 is to analyze the potentials across the junctions. In FIG. 6d the potential Vm 56 at Xm has been increased to the point that the difference in potential between the right N region 34 and Xm will be equal to the contact potential of the unbiased junction. In fact, the right junction 24 is now unbiased since the depletion region 38 associated with junction 22 on the left has been used to raise the potential at the point Xm until the right junction 24 is unbiased. It will also be found that the difference in potential (Vg−Vc) between the two N regions 30, 34, will be equal to the potential that just causes punch-through when the right junction 24 is unbiased.

In FIG. 7 the bias to the left junction 22 has been further increased which causes punch-through and large currents to flow between the two N regions 30, 34. Here the depletion width 40 of the right junction 24 has been reduced below that of the unbiased value and the potential difference between Vc and Vm is less than the contact potential; thus it is forward biased. This can be seen from the fact that the minority carrier concentrations of the right junction 80, 82 are above the equilibrium value 86. The large current that flows is due to the large concentration gradients (82–86 and 80–74) just as in a regular forward biased junction.

Operational Characteristics of Merged Depletion Regions

There are three modes of operation of the two junctions 22, 24 previously described. Under low bias the depletion regions 38, 40 are unmerged. As the biases are increased and under certain conditions, the junctions 22, 24 operate with merged depletion regions 38, 40 but with both junctions 22, 24 reverse biased. The third mode of operation occurs when the bias produces punch-through.

It is the second mode of operation that control of semiconductor devices can be achieved.

The fundamental equation of merged depletion regions 38, 40 operating in the second mode, merged depletion region without punch-through, has been developed which relates the two bias voltages, Vc and Vg, to the depletion layer width $h_1$. The other depletion layer widths can be obtained from the following relations.

$$h_2 = (Nc/Ns)h_1$$

$$h_3 = D - h_2$$

and $$h_4 = (Ns/Ng)h_3$$

where
  NC = the impurity concentration in the N region 34, A/cm$^3$
  Ns = the impurity concentration in the P region 32, 33, A/cm$^3$
  Ng = the impurity concentration in the N region 30, A/cm$^3$
  D = the distance between the two junctions, cm.

The fundamental equation is obtained by integrating the ξ fields 50, 52 across the junctions 22, 24 and applying suitable limits which result in the following equation.

$$\frac{2\epsilon(Vc - Vg)}{q} = \left[\left(1 - \frac{Nc}{Ng}\right)Nch_1^2 + 2\left(1 + \frac{Ns}{Ng}\right)Nch_1D - \left(1 + \frac{Ns}{Ng}\right)NsD^2\right]$$

where
  $\epsilon$ = the permittivity of the material, F/cm
  q = the charge of an electron, C This equation can be solved explicitly for $h_1$ and will result in two forms depending on the ratio of the impurity concentrations Nc/Ng which if equal to one results in a linear equation since the quadratic term drops out. The solutions are $$h_1 = \frac{\epsilon(Vc - Vg)}{qNs(Kc + 1)D} + \frac{D}{2Kc}$$

for the linear case and $$h_1 = \left[A\frac{2\epsilon(Vc - Vg)}{qNs} + CBD^2\right]^{\frac{1}{2}} - BD$$

for the quadratic case where
  A = Kg/(Kc(Kg−Kc))
  B = (Kg+1)/(Kg−Kc)
  C = ((1/Kc)+B)
  Kg = Ng/Ns
  Kc = Nc/Ns These equations are only valid between the limits of punch-through and where the depletion regions 38, 40 no longer merge. The equations are in terms of absolute potentials referenced to the P substrate 32 but it is more useful to consider the potential difference Vc−Vg=Vcg and assume that the absolute potential is sufficient to keep the regions 38, 40 merged.

The contact potentials have not been included but can be added to Vcg. For the linear case the contact potentials cancel; thus they need not be considered. For the quadratic case it is the difference in contact potential and not its absolute value that must be added to or subtracted from Vcg.

Punch-through can be determined from the equations since it will be the potential difference Vcg necessary to cause $h_2$ to be equal to zero for Vg punching through to Vc and will be the potential difference Vcg necessary to cause $h_3$ to equal zero for Vc to punch through to Vg. For the linear case the potential applied to cause the left depletion region 38 to punch through to the right 40 must equal the potential that causes the right 40 to punch through to the left 38. For the quadratic case this is not true.

The capacitance of these merged depletion regions will now be that of a capacitor with a depletion region dielectric but the two plates will now be the two N regions 30, 34 instead of one N and one P region. Because the width of the depletion region 38, 40 is now equal to twice the separation D for Nc=Ns, the capacitance of a junction merged with a depletion region of another junction is less than that of the unmerged junction. The capacitance per unit area for two merged depletion junctions is $$C = \left(\frac{Kc}{Kc + 1}\right)\left(\frac{\epsilon}{D}\right)$$

for the linear case and $$C = KcA\epsilon\left[\left[\frac{2\epsilon(-V_{gc})}{qN_s}\right] + CBD^2\right]^{-\frac{1}{2}}$$

for the quadratic case. It is evident from the equation of the linear device that not only is the capacitance reduced, it is independent of the applied biases.

The last characteristic to be described is that of the leakage currents between the various regions. There are two major components of the leakage current for a reverse-biased junction. The diffusion current which has been described previously will be primarily between the two N regions 30, 34 when the biases are unequal. The more important leakage current is that due to carrier generation in the depletion layer since this generation current term is orders of magnitude greater than the diffusion current component. The generation leakage term will always be between the N and P regions 30, 34, and 32, 33 and is a function of the volume of the depletion regions surrounding the junction. In the merged region 38, 40 it again will be the reversal of the $\xi$ field 50, 52 which will assign a portion of the depletion region 38 or 40 to the two junctions 22, 24. If the depletion regions 38, 40 are used to collect charges generated in the bulk material 32, the merging of the depletion regions 38, 40 can be used to apportion the collected carriers between the two junctions 22, 24.

In summary, a semiconductor device controlled by merged depletion regions 38, 40 preferably is constructed with a region of semiconductor material of a first conductivity type forming a substrate 32 and two or more regions of semiconductor material of second conductivity type 30, 34 opposite to that of the substrate material 32 forming junctions 22, 24 with the substrate material 32 where the substrate region 33 between the junctions 22, 24 is sufficiently narrow to permit the depletion regions 38, 40 of at least two, but not limited to two, junctions 22, 24 to merge under suitable bias with at least two, but not limited to two, junctions 22, 24 operated with reverse bias applied with respect to the substrate 32 in such a way that the two or more depletion regions 38, 40 merge and with the junctions 22, 24 remaining reverse biased as determined by the flow of carriers across the junctions 22, 24.

When all junctions 22, 24 remain reverse biased as determined by the flow of carriers across the junctions, with respect to large net current flow across the junctions 22, 24, the undepleted regions of second conductivity type 30, 34 are isolated from each other and from the substrate 32 and the depletion regions 36, 38, 40, 42 themselves will also be isolated from large net currents. When suitable biases are applied to the regions of second conductivity type 30, 34 with respect to the substrate region 32, the degree of coupling between the two junctions 22, 24 can be controlled from only leakage currents to forward bias punch-through while the depletion regions 38, 40 remain merged. Under suitable bias, the potential in the merged depletion region 38, 40 and the depletion regions 36, 42 on the other side of the junctions 22, 24 can be controlled by the applied biases. By adjusting the biases of the two or more merged junctions 22, 24, it is possible to adjust the widths of the depletion regions 38 or 40 on the merged side of the junction 22, 24 and on the other side 36 or 42 of the junction 22 or 24 through charge balance.

The direction of the $\xi$ field 50, 52 in the merged depletion regions 38, 40 can be adjusted by the applied biases to have a component parallel to the sides of the junctions 22, 24 having their depletion regions 38, 40 merged and the point of reversal of the $\xi$ field 50, 52 between the junctions 22, 24 in the merged depletion regions 38, 40 moves toward or away from any of the junctions 22 or 24 which have merged their depletion regions 38, 40. Within certain limits, the magnitude of both components of the $\xi$ field 50, 52 can also be adjusted.

The capacitance and capacitive coupling of one junction 22 or 24 can be controlled by the bias applied to any of the junctions 24 or 22 whose depletion regions 38, 40 have merged with that of the junction 22 or 24 whose capacitance is to be controlled with the following results.

(1) A reduction in capacitance of all areas of the junctions where the depletion regions have merged.

(2) A voltage-independent capacitance between two or more regions that form junctions with merged depletion regions when the two or more regions have equal doping concentrations.

(3) Low leakage currents between the merged junctions if the applied biases are large or nearly equal and not punching through to each other.

(4) The capacitive coupling between two or more junctions can be altered by the applied biases from the point where they are uncoupled when the depletion regions do not merge to the point where they are fully coupled when the depletion regions are fully merged.

The depletion regions 38, 40 when merged can be used to control the collection of minority carriers that are generated by any of several methods of which the following are representative.

(1) Thermally generated hole-electron pairs in the depletion regions and in the bulk material within a diffusion length of the depletion regions.

(2) Ionizing radiation that produces hole-electron pairs in the depletion regions and in the bulk material within a diffusion length of the depletion regions.

(3) Photo-generated hole-electron pairs in the depletion regions and in the bulk material within a diffusion length of the depletion regions.

(4) A forward or reverse biased junction as determined by the flow of carriers across the junction, providing a carrier gradient that will produce a diffusion current toward the edge of the depletion regions.

(5) The carrier gradients of the reverse biased merged depletion regions themselves. The reversal of the $\xi$ field 50, 52 apportions the quantity of charge collected by each junction 22, 24 as the $\xi$ field 50, 52 will be the mechanism by which the carriers are collected. This also permits the use of one junction 22 or 24 to control the leakage current of a second junction 24 or 22 by merging their depletion regions 38, 40 and applying suitable biases.

Charge Balance Depletion Region Width Control

For any junction formed from materials with uniform doping, the charge on one side of a junction must equal the charge on the other side of the junction. That this must be the case can be seen by understanding where the bound charge in the depletion regions comes from. Any semiconductor material doped to produce excess holes or electrons is still electrically neutral. The mobile charge carriers are balanced by bound charges of opposite polarity. When the two types of material are joined to form a junction, the excess carriers result in a concentration gradient which results in a diffusion current toward the junction. When two opposite type carriers meet, they annihilate each other which results in the depletion of mobile charge carriers in the depletion regions on each side of the junction. In these depletion regions there is left behind the bound charge of opposite polarity to that of the mobile carriers in the material. Since one hole combines with one electron, the fixed charges that remain on each side of the junction must be equal in magnitude but opposite in polarity.

While depletion region widths can be altered by an applied potential, as is done in conventional devices, and the potential across a junction is fixed by the charges in the depletion regions, the concept of charge balance across a junction used to control a depletion region width on the opposite side of a junction has not been used as a method of controlling semiconductor devices. The only device that uses a change in depletion region width at this time is the junction field-effect transistor and thus it will be used as an example for the purpose of illustration but it is to be realized that this method of control of a semiconductor device is equally applicable to any device that requires the alteration of a depletion region. In all junction devices charge balance must be maintained across a junction no matter what the method of depletion control used and the potential across the junction will be determined by the charges in the depletion regions. The use of charge balance across the junction has not been used in the past as the controlling method. Only an applied potential across a junction has been used to control the depletion region width on both sides of a junction.

Figure 8A:
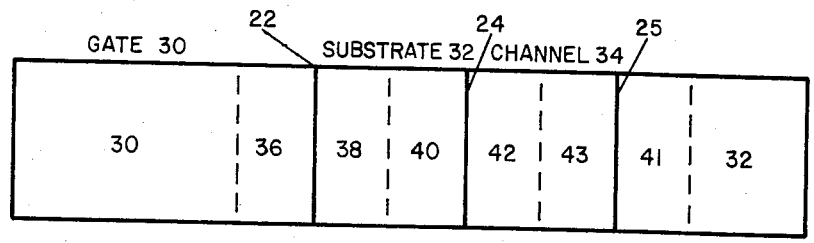
FIGS. 8a–8e, represents various methods of depletion region width control of the depletion region on one side of a junction used in charge balance depletion region width control.
Figure 8B:
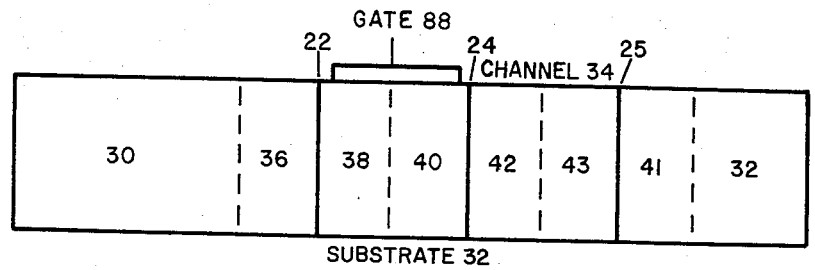
Figure 8C:
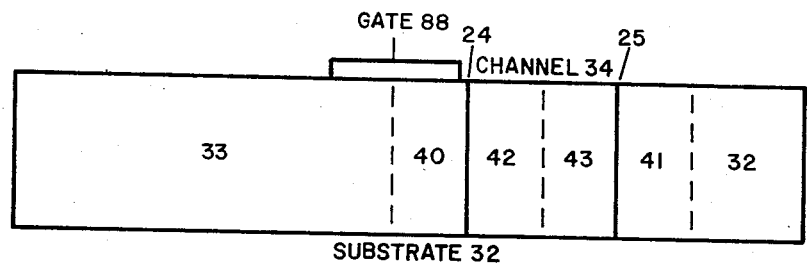
Figure 8D:
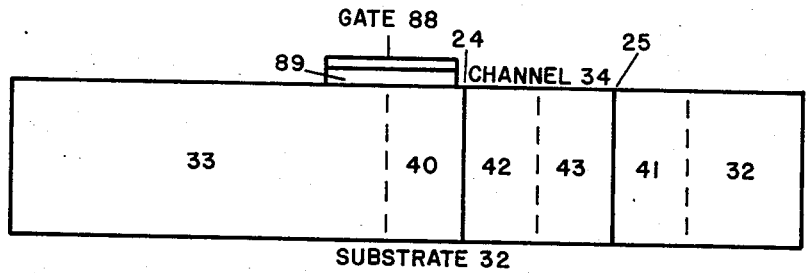

There are many methods that can be used to alter the depletion region on what will now be called the gate side 40 (the controlling side of the junction 24) which controls the depletion region on the channel side 42 (the controlled side of the junction 24) and the following methods are meant to be representative and not exclusive ways to achieve the proper results. FIG. 8 shows a number of these methods. In FIGS. 8a, 8b and 8d NPNP devices are shown while in FIGS. 8c and 8e PNP devices are shown, in each of which the P material might be the substrate while the N regions are used for control or to be controlled. As is well known, each of the regions could be of the opposite conductivity type material. Reference numerals relate to both FIG. 8 and correspond to the discussion of the previous Figures.

A preferred method to achieve charge balance depletion width control is to use a merged depletion region 38, 40 on the gate side 40 of the junction 24 to control the depletion region 42 on the channel side as shown in FIG. 8a. This method of control has been explained in the previous section on merged depletion regions.

In FIG. 8b an electrode 88 is used to produce a vertical component of the $\xi$ field 52 associated with the channel junction 24. Because the sum of the $\xi$ fields in the vertical and horizontal directions is proportional to the bound charge 64, 66 in the depletion region 40, 42, increasing the vertical component of the $\xi$ field 52 through an applied potential in the vertical direction results in a reduction in the effective charge available in the depletion region 40 to support the change in the horizontal $\xi$ field 52; thus the depletion region width 42 is reduced. In FIG. 8b the vertical component of the $\xi$ field is provided by the gate electrode 88 by one of several methods. As an example, if the entire region under the electrode 88 is a depletion region 38, 40, a vertical $\xi$ field can be produced by any type of electrode physically contacting the top of the depletion region. The depletion region 38, 40 itself may form an insulator or the electrode 88 itself can be insulated thus the vertical $\xi$ field produced will be similar to that produced in the dielectric of a junction capacitor. This gate electrode 88 can take many forms such as a metal contact or another reverse biased N region. As shown in FIG. 8c an electrode 88 can be used to produce a current in the P region 44 and the resulting voltage drop produces a vertical $\xi$ field which then operates in the previously described manner.

Figure 8E:
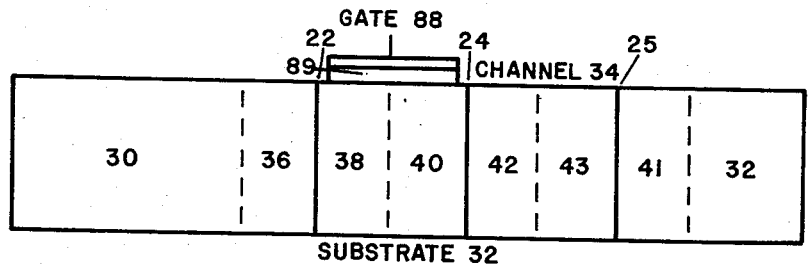

As shown in FIG. 8d the actual quantity of charge can also be altered by an MOS gate capacitor 88, 89. Here, the MOS gate 88 can be used to attract or repel free carriers from or to region 33 into or away from the depletion region 40. If the potential across the junction remains constant, the depletion region 40, 42 widths will change since $h_2/h_1 = Nc/Ns$. As depicted in FIG. 8e the same MOS structure 88, 89 is used only in this case a merged depletion region 38, 40 is used. For a given potential across the junctions, an increase in the charge 62, 64 in the merged depletion regions 38, 40 will result in an increase in the width of the depletion region 42.

In summary, a semiconductor device controlled by charge balance depletion regions width control is constructed with a region of semiconductor material of a first conductivity type forming a substrate 32, and a region of semiconductor material of second conductivity type 34 opposite to that of the first forming a junction 24 with the substrate 32, where the width of the depletion region 42 on one side of the junction 24 is controlled through charge balance across the junction 24 by altering in one of several ways the depletion region 40 on the other side of the junction 24.

The width of the depletion region 42 on one side of the junction 24 can be controlled by controlling the depletion width 40 on the other side of the junction 24 by physically limiting the width of the substrate 32 or by merging the depletion region 40 with that 38 of another junction 22.

An imposed $\xi$ field parallel to the edge of the junction 24 and perpendicular to the $\xi$ field 52 of the junction 24 depletion region 40 used to support the applied bias can be produced by, among many methods,
 (1) a surface contact 88 within the depletion regions
 (2) an MOS capacitor 88, 89 on the surface
 (3) one or more merged depletion regions 38, 40
 (4) an externally applied field
which, due to the linear nature of Poisson's equation, must be supported by the charge 64 in the depletion region 40 which reduces the effective charge 64 available for the $\xi$ field perpendicular to the junction 24 and through charge balance across the junction 24 causes a reduction in the width of the depletion region 42 on the other side of the junction 24.

Control of the potential on one side of the junction can also be used such as with an IR potential drop parallel to the edge of the junction 24 which is also reflected as a change in depletion width 42 on the other side of the junction 24. Free carrier control can also be used to attract or repel majority carriers into or out of the depletion region by, for example, an MOS capacitor 88, 89, which will alter the ratio of majority carriers of the two sides of the junction 24 which will alter the ratio of depletion 40, 42 widths for a given junction 24 bias voltage.

It should be readily apparent that many other structures and combinations of structures can be found that will provide a method of controlling a depletion region through charge balance.

Merged-Depletion Junction Field-Effect Transistor

While there are many device structures that can be obtained using merged depletion regions and/or charge-balance depletion region width control, a junction field-effect transistor controlled by merged depletion regions to be called the MFET (merged-depletion junction field-effect transistor) has the potential of being the most flexible and useful of all merged-depletion charge-balance devices.

For purposes of illustration and description the operation and construction of a discrete device is disclosed. From a review of this disclosure it should be apparent that there are many varied applications of the invention including the construction of vertical devices and, because the gate 30 and channel 34 may be constructed of the same type material, it is possible to extend the drain diffusion of one device to form the gate 30 of another. It is also possible for a channel 34 to act as the gate 30 for a second device, thus eliminating interconnections of any kind. In fact, because of input and output compatibility many types of multielectrode compound structures are possible including for the first time three-dimensional structures. Because of these features it is anticipated that the invention will find its greatest applicability in very large scale integrated (VLSI) circuitry.

Figure 9A:
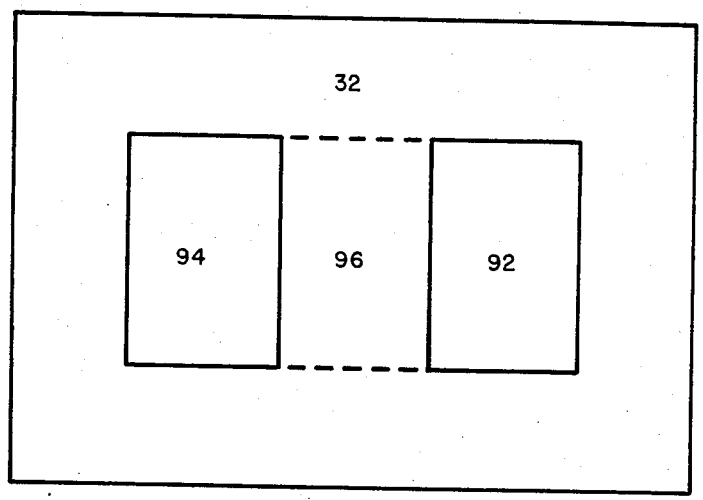
FIG. 9, comprising FIGS. 9a and 9b, diagrammatically illustrates a top view and a sectional side view of a junction field-effect transistor which can be controlled by merged depletion regions in the substrate.
Figure 9B:
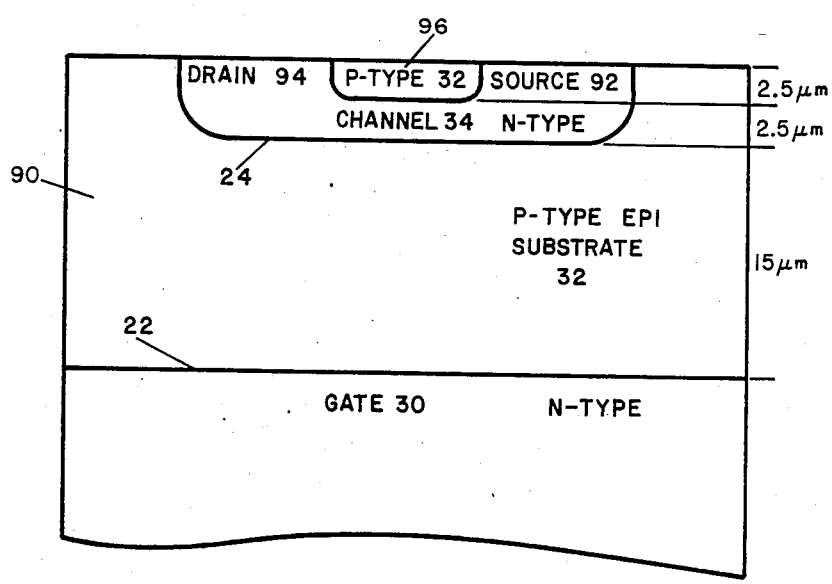

FIG. 9, consisting of FIGS. 9a and 9b, shows a test device 90 constructed in accordance with the invention. Referring to FIG. 9b, the test device consisted of an N-type region 30 utilized as the gate of the device. A P-type epi-layer substrate 32 contacts the gate 30 and contains an N region diffused into the epi-layer 32 which forms the source 92, drain 94, and channel 34. A P-type diffusion 96 is applied over the N diffusion to narrow the N diffusion to produce the channel 14. As shown in FIG. 9a the P diffusion 96 connects directly to the P-type epi-layer and becomes part of the substrate 32.

Figure 10A:
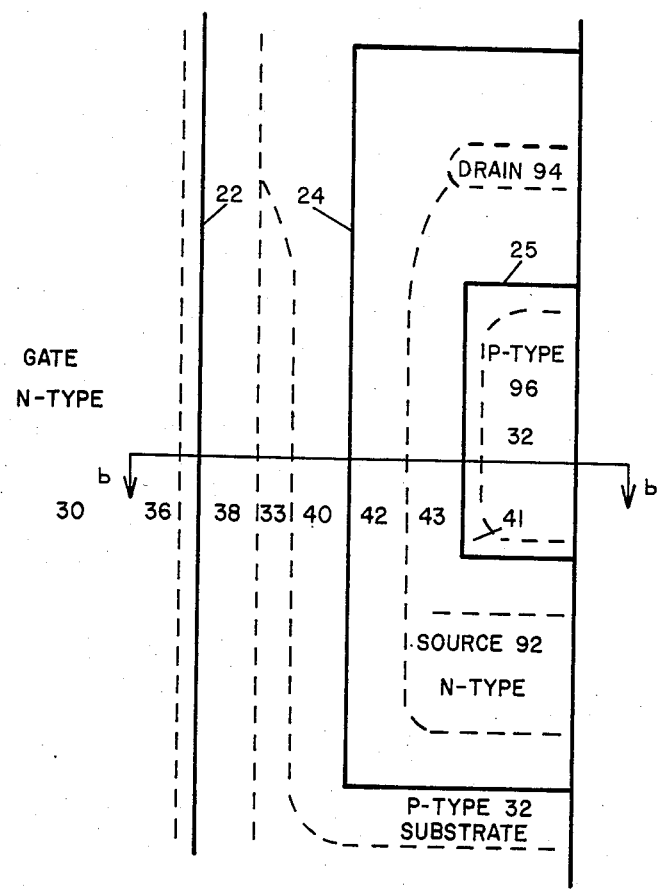
FIG. 10, comprising FIGS. 10a–10c, diagrammatically illustrates a sectional view of a semiconductor device controlled by depletion regions showing the depletion regions and demonstrating the principles of operation particularly as it relates to the merging and interaction of the depletion regions.
FIGS. 10b and 10c represent the $\xi$ field and potential associated with the $\xi$ field for the operations described in connection with FIG. 10.
Figure 10B:
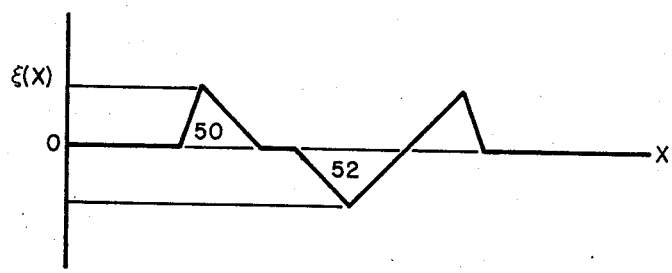
Figure 10C:
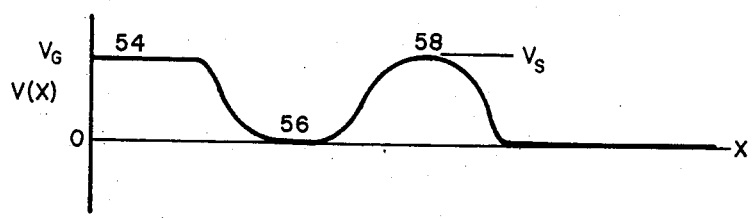
Figure 11A:
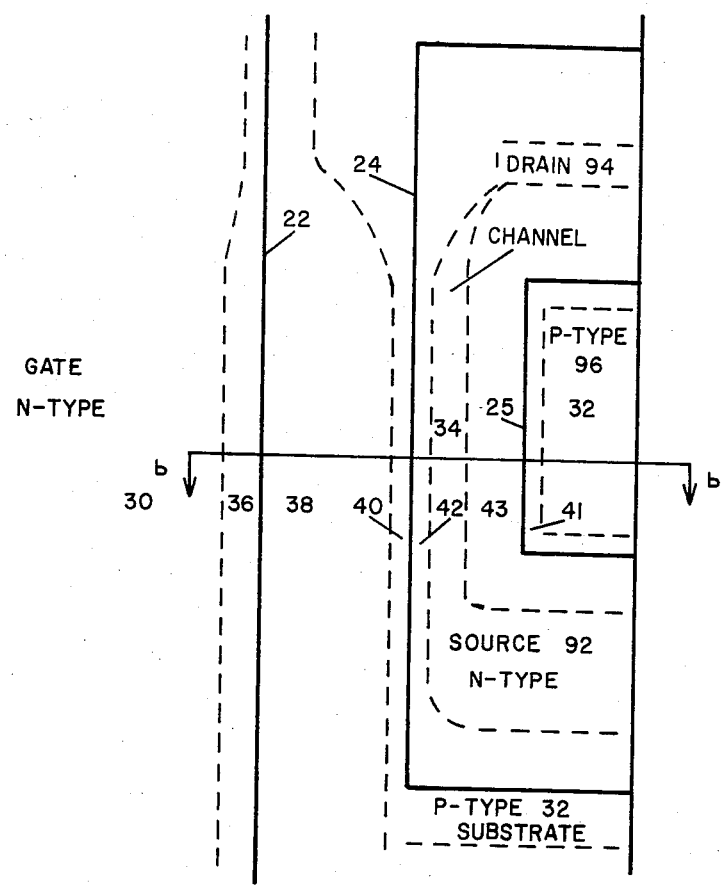
FIG. 11, comprising FIGS. 11a–11c, diagrammatically illustrates a sectional view of the device of FIG. 10 further demonstrating the principles of operation particularly as they relate to the merging and interaction of the depletion regions.
FIGS. 11b and 11c represent the $\xi$ field and potential associated with the $\xi$ field for the operation described in connection with FIG. 11.
Figure 11B:
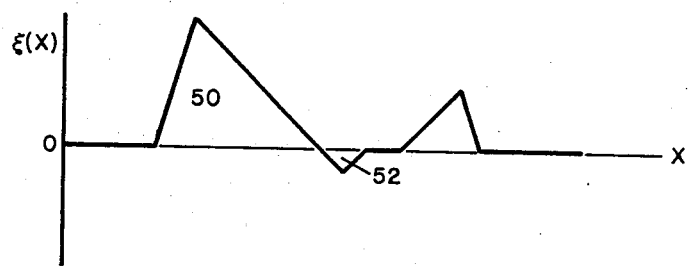
Figure 11C:
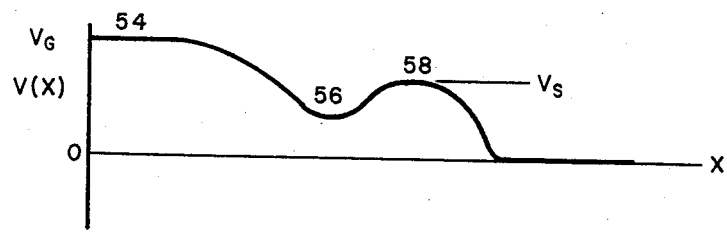
Figure 12A:
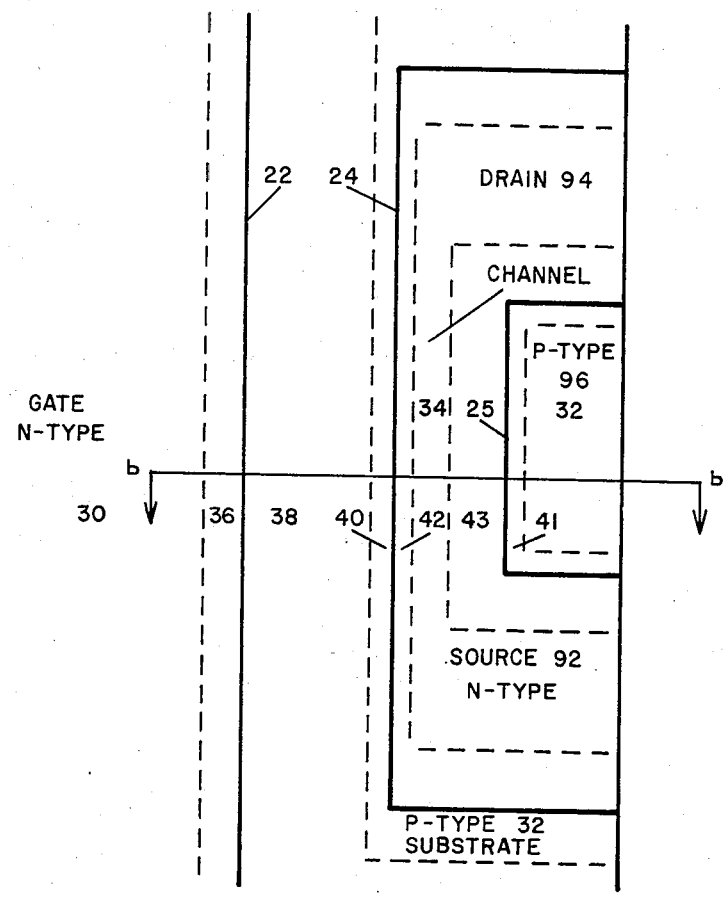
FIG. 12, comprising FIGS. 12a–12c, diagrammatically illustrates a sectional view of the device of FIG. 10 further demonstrating the principles of operation particularly as they relate to the merging and interaction of the depletion regions.
FIGS. 12b and 12c represent the $\xi$ field and potential associated with the $\xi$ field for the operation described in connection with FIG. 12.
Figure 12B:
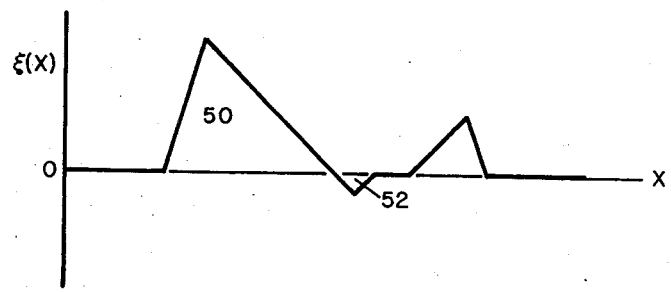
Figure 12C:
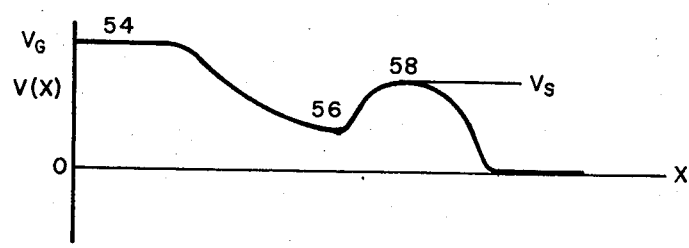

FIGS. 10, 11 and 12 diagrammatically show a cross section of the device 90 in operation with the associated depletion regions indicated by the dotted lines. Operation of the device will be discussed in more detail below. Basically FIG. 10 shows the device 90 with the gate voltage equal to the source voltage and the source voltage high enough to pinch off the channel 34. The drain 94 is at a higher voltage so that the device 90 is operating like a conventional pinched-off junction field-effect transistor (JFET). In FIG. 11 the gate voltage has been increased to equal the drain voltage. At this higher potential the depletion region 38 of the gate 30 in the P epi-layer substrate 32 merges with the depletion region 40 of the channel 34. This shifts the point of zero $\xi$ field 52 in the epi-layer 32 toward the channel 34. Because the overall charge balance must be maintained the depletion region 42 in the channel 34 decreases and opens up the channel 34. However, as shown in FIG. 11, the channel 34 is still pinched off at the drain end 74 and the device 90 operates in the saturation region of its transfer curve.

FIG. 12 shows what occurs when the drain voltage is lowered to the source voltage. At this point the entire channel 34 is open and the device operates in the linear region of its transfer curve.

A detailed description of the principles of operation of the device is as follows:

Channel Operation

Figure 13A:
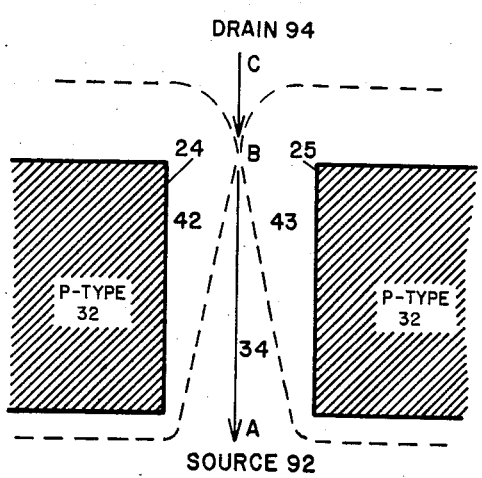
FIG. 13, comprising FIGS. 13a–13d, diagrammatically illustrates the channel operation of the device under various biases.
Figure 13B:
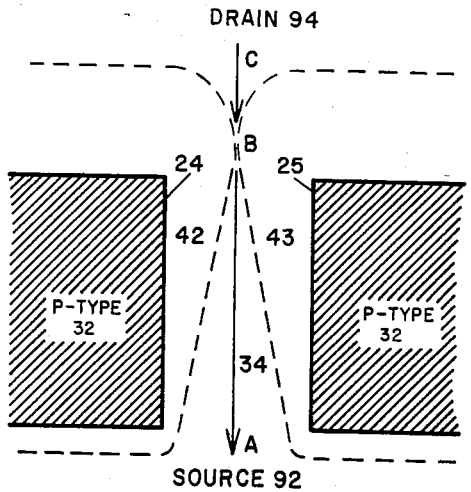

FIG. 13, comprising FIGS. 13a–13d, shows the channel 34 of the device 90 which is similar in operation to the channel of a basic junction field-effect transistor. As shown, it is an N channel device with the channel 34 being formed by two P-N junctions 24, 25. If point A at the source end 92 of the channel 34 is held at the same potential as the P regions 32, and the potential at point C is gradually increased, the current from A to C will gradually increase. This current forms an IR potential drop along the channel 34 so that the potential will increase from A to C; thus the P-N junctions 24, 25, have different reverse biases along the length of the channel 34. This causes depletion regions 42, 43 associated with the junctions 24, 25 to extend into the channel 34 a greater distance at end C than at end A. At end C a point is reached where the depletion regions 42, 43 from the two sides meet and pinch off the channel 34 as shown in FIG. 13a. Any further increase in the potential at end C will not cause the current through the channel 34 to increase. If point B is that point in the channel 34 where the two depletion regions 42, 43 have pinched off the channel 34, once pinch-off is reached, no matter how much the potential at C is increased, the potential at B will not increase.

With B held constant and C increasing in potential, an $\xi$ field must develop along the channel 34 from B to C. This $\xi$ field will sweep any carriers that reach point B out of the region. The current is thus limited by the carriers that reach point B. This current is the same as the current at pinch-off, since the channel depletion regions 42, 43 from A to B will not change after pinch-off has been reached. Once pinched off, the transistor 90 operates in the saturation mode since an increase in the potential at point C will not cause an increase in the channel current.

In the usual description of the JFET, saturation is explained by the phenomenon of the limiting value of mobility at very high values of an $\xi$ field. This theory can be explained with reference to the channel current. Since the current through the channel 34 must be continuous, and the area of the channel 34 is decreasing, the current density must increase until theoretically at the pinch-off point, the current density should become infinite due to the zero channel area.

What actually occurs at pinch-off is that the channel areas does not really go to zero, but is forced open sufficiently to allow the required current to flow. According to the limiting mobility theory, the current density will not increase at the pinch-off point since the carriers have reached their velocity limit in the material. For a fixed number of carriers, increasing the potential at end C increases the $\xi$ field, but the current does not increase, as expected from a simple mobility theory, since the carriers are at their velocity limit. The problem with this theory is that it centers at the pinch-off point to explain current limiting, yet it is the assumption that the carriers at the pinch-off point are constant with increasing potential at end C that yields the information about the magnitude of the saturation current. The velocity limiting theory is correct in that it does explain why the channel 34 will not completely pinch off, but it ignores the reason why the carrier concentration at the pinch-off point is constant.

It is for this reason that attention should be shifted to the channel area before the pinch-off point to determine the performance of the device 90. An approximation is made that, at point B in the channel 34, the potential will not increase after saturation is reached. In fact it is an increasing concentration of carriers in the channel 34 which lowers the potential at point B, and in turn opens the channel 34 sufficiently to allow the current to flow in saturation. Thus it is quite accurate to assume that the potential at B will not increase above its pinch-off value. Since the potential at B is fixed at pinch-off, if the potential at A remains constant the current through the lower end of the channel 34 will not increase even though the potential at C is increased.

Figure 13C:
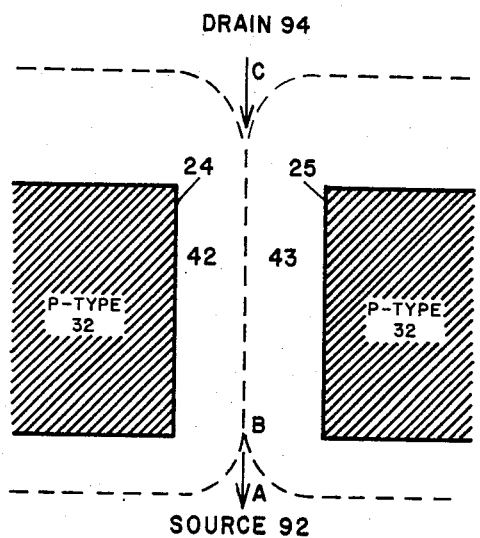
Figure 13D:
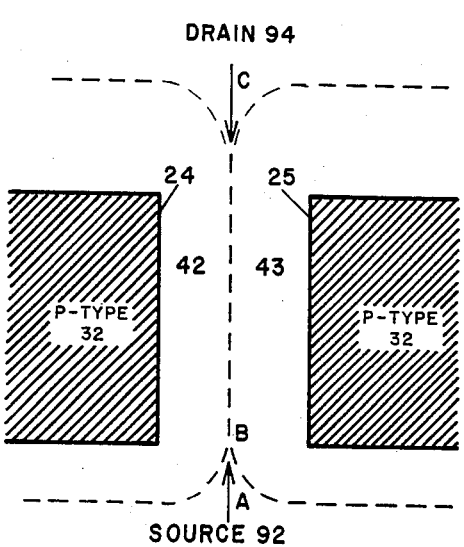

If the potential at A is now also increased as shown in FIG. 13c, the current through the channel 34 will decrease. This occurs for two reasons. First, the potential from A to B decreases and, since the channel 34 is resistive, the current will also decrease. In addition, the depletion regions 42, 43 along the channel 34 will increase as shown in FIGS. 13c and 13d so that more of the channel 34 will be pinched off. When the potential of A reaches pinch-off, the channel 34 will be entirely pinched off as shown in FIG. 13d. At this point the current through the channel 34 will be zero. The reason for the zero current is not because the channel is completely pinched off but because, when both ends of the channel 34 are above pinch-off, the $\xi$ field along the channel 34 will be from A to B and from C to B. Instead of having the field from A to B bring charges into the channel 34 for the $\xi$ field of C to sweep out, the $\xi$ field from A to B also sweeps out the charges in the channel 34. Thus when both ends are above pinch-off, the channel 34 will not conduct because there are no charge carriers in the channel 34.

The application of a positive voltage to the source 92 at end A produces the same result as the application of a negative voltage to the P region, which in a conventional JFET would be the gate.

Device Operation

As shown in FIG. 13, the application of reverse biases to the source 92 and drain 94 of an N channel device 90 with respect to the P substrate 32 will cause a depletion region to spread into the channel 34. When the depletion regions meet in the center of the channel 34, the potential at the center of the channel 34 is fixed and cannot increase. However, the depletion regions also spread into the P region 32. In conventional devices the P regions are more heavily doped than the channel; so that most of the bias voltage appears across the depletion region of the channel.

In a field-effect device 90 controlled by merged depletion regions, the P region 32 is not heavily doped, which allows the channel junction depletion region 40 to spread sufficiently into the P region 32. The control of the channel depletion region 40 on the P side of the channel junction can then be used to control the depletion region 42 on the N side of the channel junction 24 by using charge balance.

FIGS. 10, 11, and 12 show a semiconductor device 90 which employs the methods set forth above to control the P-side channel depletion region 40 of the channel junction 24 in the P substrate 32. The embodiment shown in FIGS. 9–12 is one embodiment of the invention and is illustrated as shown for ease of discussion. However, in other applications, the devices 90 can utilize a gate 30 or any combination of gates 30 separated from any side of the channel 34.

FIG. 10a shows the source 92, drain 94, channel 34, gate 30, and substrate 32, 96 of a field-effect device 90, with the associated depletion regions 36, 38, 40, 41, 42 and 43 indicated by the dotted lines. The drain 94 and source 92 are of N-type material, and are joined by a channel 34 of the same N-type material and impurity concentration as the source 92 and drain 94. The concentration of the N region 34 is equal to that of the P region 32; thus the depletion region 40, 42 will spread out an equal distance on each side of the channel junction 24. The gate 32 is a very heavily doped N region, placed close enough for the P depletion regions 38, 40 in the substrate 32 to merge. FIG. 10b shows the magnitude and direction of the $\xi$ field 50, 52 at the line b—b 34 drawn from th gate 30 to the opposite side of the channel 34 in FIG. 10a. FIG. 10c shows the potential corresponding to the $\xi$ field of FIG. 10b.

In FIG. 10 the gate voltage Vg is equal to the source voltage Vs and the source voltage is high enough to pinch off the channel 34. The drain 94 is at a higher voltage so that, in this configuration, the device 90 is operating like a pinched-off JFET. With the low gate voltage, the gate depletion region 38 does not meet the channel depletion region 40 and is shown in FIG. 10a by the dotted lines, in FIG. 10b by the zero $\xi$ field between the two P depletion regions, and in FIG. 10c by the section of the P region 33 between the gate and channel at zero potential.

Because the channel 34 is pinched off, the potential at the center of the channel 34 is the pinch-off voltage which is labeled Vs in FIG. 10c. For a device constructed in the manner shown in FIGS. 9–12, it is important for the source 92 to be at pinch-off because if it is increased much above pinch-off, the performance of the device 90 will suffer. For this reason the source is taken to be at the pinch-off potential.

FIG. 11 has the same configuration as FIG. 10 except that the gate voltage has been increased to equal the drain voltage. At this higher potential, the depletion region 40 of the channel 34 in the P region 32 will now merge with the depletion region 38 of the gate 30. The dotted line in FIG. 11a in the P region 32, at the reference line, is the point Xm where the $\xi$ field is zero and assigns a portion of the depletion region 38, 40 to the gate 30 and channel 34.

The $\xi$ field of FIG. 11b shows how the increase in potential of the gate 30, with respect to the P epi-layer 32, has shifted the point of zero $\xi$ field in the P region 32 toward the channel 34. Due to overall charge balance, the depletion region 42 in the channel 34 must decrease and open up the channel 34. The gate 30 must be adjacent to the entire channel 34, otherwise only a localized pocket of the channel 34 will open up and no current will flow. When the gate 30 opens the entire channel 34, the device 90 turns on and conducts. FIG. 11a shows the channel 34 pinched off at the drain end 94, as it will be; thus the device operates in the saturation mode in a manner similar to a conventional junction field-effect transistor.

As stated above, if the source 92 is raised above the pinch-off voltage of the channel 34 there will be a decrease in performance if a gate 30 is used on only one side of the channel 34 as is shown in FIG. 10. If the gate 30 is not opposite both sides of the channel 34, and the source 92 is above pinch-off, the depletion region 43 on the opposite side of the channel 34 will spread into the channel 34 as the depletion region 42 from the gate side retreats. In effect, the device will operate as a limited source follower.

That this is the case can be seen by examining the channel 34 when it is conducting. The channel potential must be higher than the source if the $\xi$ field is not to reverse along the channel 34. The effect of the gate depletion region 38 merging with th channel depletion region 40 is to increase the potential on the P side 32. As is shown in FIG. 11, the channel depletion region in the channel 42 retreats and the channel 34 opens. This occurs because the source is just at pinch-off. It it is higher, the channel voltage must be increased until it is above the source. This is done by increasing the potential on the P side. The increased channel potential will cause the reverse bias of the junction 25 opposite the gate 30 to increase, since there is no merged region on that side. The channel voltage will continue to increase, without the channel 34 opening up, until the channel potential is equal to the source 92. As the gate voltage is increased, the channel depletion region 40 on the gate 30 will retract until the point when it is equal to its unbiased value, at which time any further increase will punch through from the gate 30 to the source 92 and an infinite current will result. When the source voltage is above the channel pinch-off voltage, the depletion region 43 from the opposite side 25 moves into the channel 34 and the on-resistance of the device 90 will be higher because of the partial closing of the channel 34. This is not a problem when the gate 30 is applied to both sides, since both depletion regions 42, 43 are forced to withdraw from the channel 34.

FIG. 12 shows what occurs when the drain voltage is lowered to the source voltage. At this point the entire channel 34 opens, and the device 90 operates ifn the nonsaturation region.

This method of control can be utilized in certain logic functions to implement an AND function. If a vertical device has two gates 30 on opposite sides of the channel 34 and the source 92 is just at pinch-off, if either gate potential is increased, current will flow in the channel 34. This will implement an OR function. If the channel 34 is a square with four equal channel sides, the channel 34 will pinch-off from all sides. If the gates 30 are on opposite sides of the channel 34 they will open the channel 34 from that side but the channel 34 will still pinch-off from the sides at right angles to the gate side of the channel 34. It is thus necesssary for two gates 30 to be at right angles to each other and both gates 30 to have a high potential if the current is to flow in the channel 34. This will produce an AND function.

FIG. 14 shows a vertical JFET formed to allow the construction of the device 90 in integrated form. The device 90 shown is only approximate and is only for use as an illustration of the design. Regions A, B, C, D, E, F, G, and H are all produced by N type diffusions while I, J, K, and L are produced by P type diffusions. Regions F and G are the gate 30 while regions A and D are interchangeable as the source 92 and drain 94. Regions B and F are the out diffusions from the N implanted regions A and E respectively. Regions C and G are the in diffusions of the implanted N surface 101 regions D and H respectively. For the P regions, J is the out diffusion of region I while K is the in diffusion of region L on the surface 101.

The device can be constructed by first implanting impurities in the semiconductor material 103 regions A, E, and I and then growing an epi-layer 105 before any exensive drive-in diffusion of these lower regions occurs. The regions D, H, and L on the surface of the epi-layer 105 are then implanted followed by the drive-in diffusion step. The impurities on the surface will diffuse into the epi-layer 105 while those impurities in the bottom semiconductor layer 103 will out diffuse into the epi-layer 105. Where regions B and C meet, the concentration is selected to give the required channel concentration to produce pinch-off at the required voltage and this concentration can be controlled by the implanted impurities and by the drive-in step.

Because of the diffusion profiles both the N and P regions will be lightly doped near the center of the epi-layer 105 with the doping becoming heavier toward the upper and lower, 101, 102 surfaces. These heavily doped regions provide a low resistance path from the lightly doped regions to the surfaces 101, 102. The heavily doped regions also prevent the gate and channel depletion regions 38, 40 from merging in areas where the gate 30 does not control the channel 34. This capacitive coupling is an unwanted parasitic capacitance.

In this structure the length of the channel 34 will be only that portion of the channel 34 where the impurity concentration is low enough to allow the channel 34 to pinch-off at the required voltage.

Figure 14A:
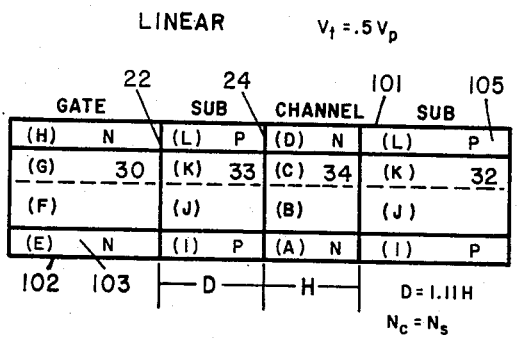
FIGS. 14a–14t, shows in FIGS. 14a–14d several configurations of a vertical junction field-effect transistor for use in integrated circuitry, and FIGS. 14e–14t graphically show the changes in $\xi$ field of the device due to changes in configuration, doping and applied biases.
Figure 14B:
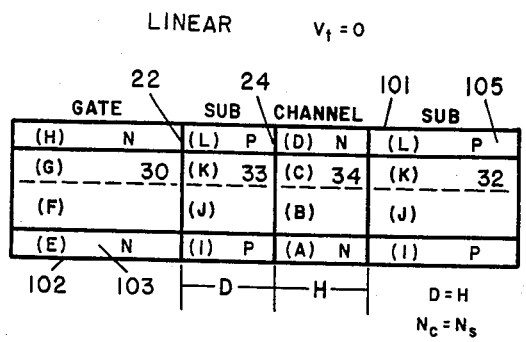
FIG. 14, comprising
Figure 14E:
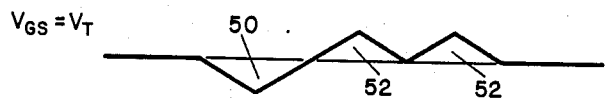
Figure 14I:
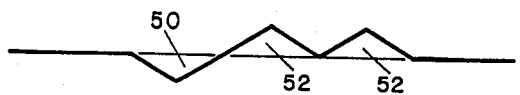
Figure 14F:
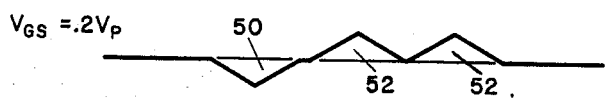
Figure 14J:
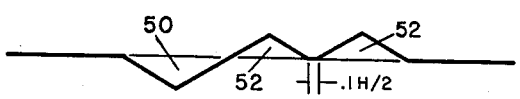

For the purpose of analysis of operation it can be assumed that the P regions 32 are grounded. The plots of the $\xi$ fields in FIG. 14, FIGS. 14e–14t, represent the $\xi$ fields of the device 90 sectioned through the minimum doping level near the middle of the epi-layer 105 as shown by the dotted line. All the potentials are normalized to the voltage necessary to pinch-off the channel; that is, all voltages are measured as multiples of the pinch-off voltage, Vp. All dimensions when given are normalized to the channel height, H.

In most applications the device will be operated in the enhancement mode; thus a potential must be applied to the source 92 equal to Vp to pinch-off the channel 34. Since this is a bias voltage across a reverse biased P-N junction 24, the current that must be supplied will only be the leakage current of the junctions. This potential can be supplied by a bias supply off the chip or a standard on chip charge pump technique can be used as is now commonly used for substrate bias in NMOS circuits.

To maximize performance, the channel 34 should have as low a resistance as possible and the influence of the gate 30 on the channel depletion region 42, should be maximized. To lower the resistance of the channel 34, it should be as heavily doped as possible. Since the doping is fixed by the pinch-off voltage requirements and the channel height, H, the only other way to reduce the channel resistance is to shorten the length of the channel pinch-off region. The limits on the length of the channel 34 are set by the avalanche breakdown characteristics of the channel 34 at the applied drain to source voltage.

The second method of enhancing the performance of the device, 90, that of maximizing the gate 30 influence on the channel depletion region 42, is illustrated in the series of plots of the $\xi$ fields in FIG. 14. The plots, FIGS. 14e–14t, are arranged horizontally according to the configuration of the device 90 and the threshold voltage and arranged vertically according to the normalized applied gate voltage. In these figures the degree of channel opening is a relative measure of the gain of the device. The gain of all field-effect devices is really determined by the number of charges under the gate area and is thus a function of the gate capacitance and the impurity concentration under the gate. In FIG. 14 the gate capacitance increases from left to right as does the gain.

The first column in FIG. 14, FIGS. 14e–14h, consists of the ξ field plots of a linear device, the gate concentration equal to the channel concentration, with a threshold voltage of 0.5 Vp. In all the figures, the area under the ξ field 52 will be equal to the pinch-off voltage while the area under the ξ field 50 will be equal to the gate voltage. The first row in FIG. 14, FIGS. 14e, i, m and q, shows the threshold voltage and is equal to area 50 minus area 52. The second row, FIGS. 14f, j, n and r, indicates the ξ fields 50, 52 when the input voltage is 0.2 Vp and for this case since it is below the threshold voltage, the gate and channel depletion regions 38, 40 have not merged. The third row, FIGS. 14g, k, o and s, shows the input voltage equal to Vp and for this configuration, the channel opening is 0.2H/2. The last row, FIGS. 14h, l, p and t, shows the maximum voltage that can be applied to the gate 30 without the gate 30 punching through to the channel 34 and in this case it is equal to 3.93 Vp. For this linear device the channel doping and the substrate doping are equal.

The second column FIGS. 14i–l, shows a linear configuration with the threshold voltage equal to zero. As can be seen from the figures, the channel 34 opens further than for the configuration shown in the first column. The lower the threshold voltage the gate 30 to channel 34 spacing D has been decreased and is now equal to the channel height, H; thus the gate capacitance increases and the increase is reflected in the channel opening. It also results in a reduction in the maximum voltage that can be applied to 3 $V_p$.

The third column FIGS. 14m–p shows a quadratic configuration with the threshold voltage equal to zero and with the channel concentration equal to the substrate concentration. That this is a quadratic device, the gate concentration not equal to the channel concentration, can be seen by the vertical drop of the ξ field 50 in the gate 30 region. The gain also increases because there is greater charge adjacent to the gate capacitance depletion region which increases the gate capacitance. $V_{max}$ is now reduced to 1.9 Vp.

Figure 14G:
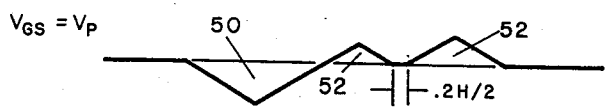
Figure 14K:
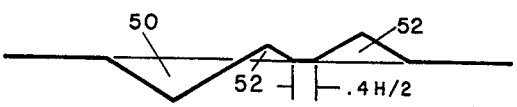
Figure 14H:
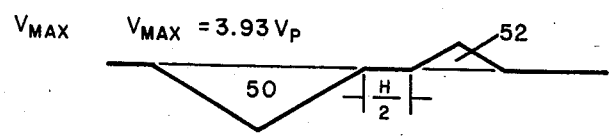
Figure 14L:
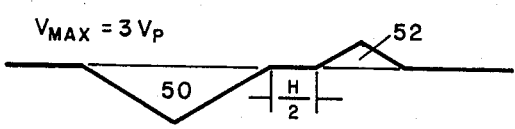
Figure 14C:
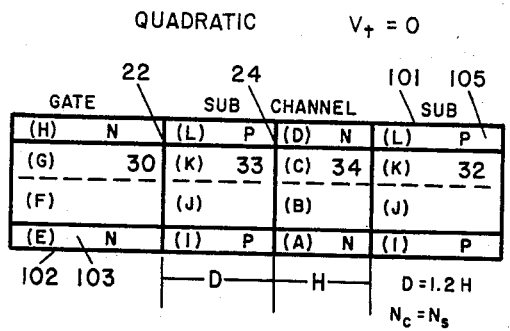
Figure 14D:
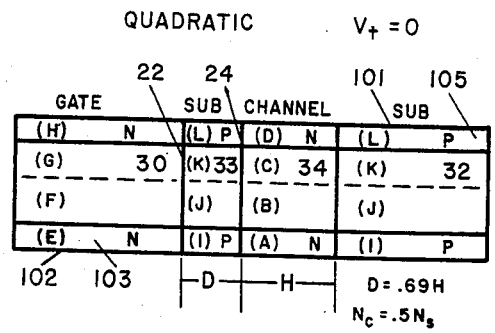
Figure 14M:
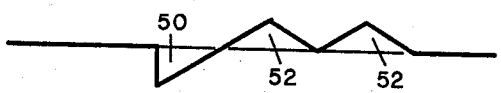
Figure 14Q:
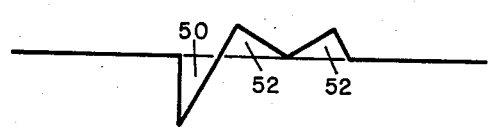
Figure 14N:
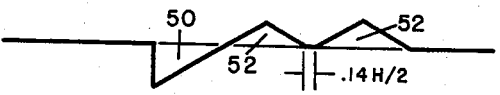
Figure 14R:
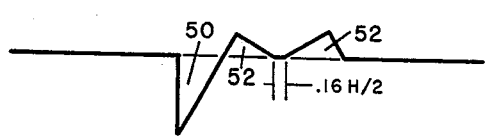
Figure 14O:
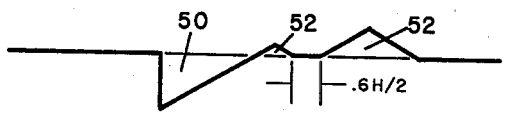
Figure 14S:
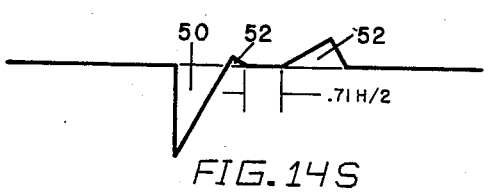
Figure 14P:
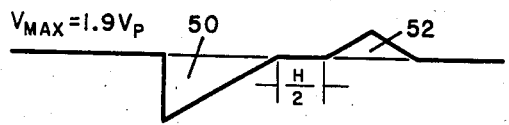
Figure 14T:
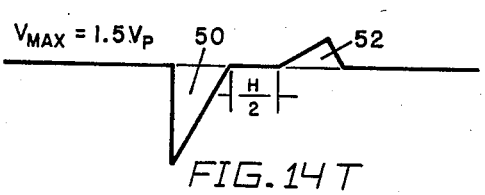

The last column FIGS. 14g–t shows a quadratic configuration with the threshold voltage equal to zero but with the substrate doping twice that of the channel. The gate 30 to channel 34 separation D decreases; thus the capacitance increases. $V_{max}$ is now 1.5 Vp.

The actual performance of these structures will be determined primarily by the size of the channel height, H, or the gate 30 to channel 34 spacing, D, whichever is less. The minimum dimension is determined by the limits of the photolithographic techniques and as this dimension gets smaller the performance increases due to the higher channel doping for a given pinch-off voltage and to a reduction in the parasitic capacitances of the gate and drain junctions.

A comparison of the MFET to an MOS transistor can give some indication of the relative merits of the two devices. When comparing the gains of the two devices, the MOS device will usually have a higher gate capacitance while the MFET will have a lower channel resistance due to the high mobility and shorter channel lengths. Three different comparisons have been made based on the minimum photolithographic feature.

For devices where 5 μm is the minimum dimension which corresponds to conventional LSI MOS transistors, the MOS channel length is 5 μm with the oxide thickness equal to 0.1 μm. For the MFET the effective channel length is 0.2 μm while the gate to channel spacing is 2.5 μm for a device with the substrate doping twice that of the channel. The MOS gate capacitance is 8 times that of the linear MFET and 4 times greater than the quadratic. The MFET's channel resistance is 50 times less than that of the MOS device; thus the MFET has a gain advantage over an MOS device of 6 times for the linear MFET and 12 times for the quadratic device.

With a minimum dimension of 2.5 μm the MOS channel length is 2.5 μm with an oxide thickness reduced to 0.04 μm which is close to the minimum due to the dielectric strength of the gate oxide. The MFET has an effective channel length of 0.2 μm and a gate to channel spacing of 1.25 μm. The MOS gate capacitance is 10 times that of the linear MFET and 5 times greater than the quadratic MFET. The MFET channel resistance is 25 times less than that of the MOS device; thus the linear MFET's gain is 2.5 times that of the MOS device while the quadratic's gain is 5 times greater than that of the MOS transistor. At this level the MOS performance has improved due to the very thin oxide.

At 1 μm the MOS channel length is 1 μm and the gate oxide thickness is still 0.04 μm. For the MFET the channel length is still 0.2 μm while the gate to channel spacing is 0.5 μm. The MOS gate capacitance is 4 times that of the linear MFET and only twice the capacitance of the quadratic MFET. The MFET channel resistance is 10 times less than that of an MOS device. The relative gain of the linear device is 2.5 times greater than an MOS device while the quadratic device has a gain 5 times greater than the MOS device.

These figures show the superiority of the MFET over an MOS device when the gains of the devices are compared. What is not shown is the fact that the MOS device will have a higher propagation delay than the gain terms would indicate due to the higher gate capacitance of the MOS device which must be driven by the preceding stages. In addition, the MFET has much less drain to gate feedback capacitance which again further improves performance.

As can be seen from the above considerations, the MFET will always have greater gain than an MOS device and at the same time a large reduction in operating device capacitance.

CONSTRUCTION OF A TEST DEVICE

A test device was constructed to prove that the device 90 would operate. This device 90 is shown in FIG. 9 and was constructed as follows. Wafers were utilized having an epitaxial layer 32 doped oppositely to that of an N-type semiconductor material layer 30 doped with antimony and having a resistivity of 0.02 ohm-centimeter. The P-type epi-layer 32 was boron doped with an impurity concentration of $5 \times 10^{14}$ and 20 micrometers thick.

Construction of the device was completed by diffusing a light N region 34, 92, 94 into the P-type epi-layer 32. A P+ diffusion 96 was then applied over the N diffusion which narrowed the N diffusion and produced the channel 34. This P diffusion 96 connected directly to the epi-layer and thus became part of the substrate 32.

The N regions 34, 92, 94 were diffused to a depth of 5 micrometers and a surface concentration of $2.5 \times 10^{16}$ A/cm$^3$ which was followed by the P diffusion 96 to a depth of 2.5 micrometers and a surface concentration of $1 \times 10^{17}$ A/cm$^3$. For this device 90 the pinch-off voltage was 8.2 volts which was below the avalanche breakdown voltage of the junctions. The threshold voltage Vt was calculated to be 15 volts. The threshold voltage is that voltage applied to the gate 30 just necessary to start the channel 34 conducting when the source 92 is just biased to pinch-off.

The steps used to construct the device 90 are shown in FIG. 15. Photographic techniques were utilized to construct photomasks which were then used to mask off the surfaces by photolithographic techniques. The surface layer was then etched to control where the diffusion was to take place.

Diffusion masks of silicon dioxide were used to mask the wafer. An oxide thickness of 0.30 micrometers was found to be sufficient to insure that a pattern remained after the dopant source was removed. This oxide was grown in steam at 1,100 degrees centigrade for 20 minutes. After the oxide was grown, the diffusion pattern was etched in the oxide using standard semiconductor photolithographic techniques and a HF etch.

A two-step diffusion was performed. With this type of diffusion, an erfc diffusion was first performed to place a fixed quantity of impurities into a thin layer near the surface of the wafer. After this predeposition, a drive-in was performed to produce the proper Gaussian profile. The dopant sources used were liquid boron and liquid phosphorous.

After the oxide was etched, the wafer was coated with a phosphorous source. The times of the predepositions and drive-ins were varied. The P diffusion with the boron source was done in the same way using the same techniques. All the oxide was removed from the wafer when the boron dopant was remove. While all characteristics could not be checked on this test device, sufficient testing was accomplished to show that the device would operate as intended.

Operational Characteristics

In operation, the channel 34 of the device 90 can be pinched off by applying a voltage to the source 92 that is greater than Vp, the voltage that causes the depletion region 42 in the N region 34 to close off the source end 92 of the channel 34. If the drain 94 is then made more positive than the source 92 and with the gate 30 unbiased, the entire channel 34 is pinched off and no current will flow. If the drain voltage is increased the current still will not change. If a positive voltage is applied to the gate 30, the gate depletion region in the substrate 38 will merge with the depletion region of the channel in the substrate 40. If the gate potential is further increased, the depletion region in the channel will narrow and the channel 34 will open and current will flow. When operated in this manner, the device operates like an enhancement-mode JFET, one that is normally off until a gate signal turns it on.

The fundamental equation relating the two bias voltages Vc and Vg to the depletion layer width $h_1$, and the other depletion region widths, is stated above. The threshold voltage Vt, the voltage necessary to just start the channel 34 conducting, occurs when the source end 92 of the channel 34 just starts to open. It is determined by the merged depletion equation and, therefore, the threshold voltage Vt is a function of the gate 30 to channel 34 spacing and can be altered within any circuit by the design layout. If a channel 34 of width H, having P and N concentrations of Ns and Nc, respectively, is to pinch off, it is essential that D Ns>(H/2)Nc. If this equation does not hold, there will be insufficient charge in the P region 32 to balance the charge in the N regions 30, 34.

DC Characteristics

The DC characteristics of the device 90 can be obtained by solving the merged depletion equation for $h_1$ and substituting it into the channel equation for a junction field-effect transistor. Because there are two solutions to the equation, there will be two sets of characteristics based on the linear and quadratic solutions.

The device in operation will have a linear and saturated region. Saturation will occur when the drain to source voltage Vds is greater than the gate to source voltage Vgs, minus the threshold voltage Vt. The drain current for the linear case, when the gate and channel depletion regions 38, 40 have merged, can be expressed as follows:

$$Ids = \frac{\sigma W}{L}\left[\left(H - \frac{D}{K}\right) - \left[\frac{\epsilon(Vds - 2Vgs)}{qNs(K + 1)D}\right]\right]Vds$$

where
Ids = the drain to source current, Amps,
$\sigma$ = the channel conductivity, mhos,
W = the effective channel width, cm,
Vds = the drain to source voltage, Volts,
H = the channel height, cm,
K = the N to P impurity concentration ratio,
Vgs = the gate to source voltage, Volts,
L = the channel length, cm.

If the threshold voltage is referenced to the source, then, $$Vt = -\frac{qNs(K + 1)D}{2\epsilon}\left(H - \frac{D}{K}\right)$$

and the drain current in the linear region of operation is given by $$Ids\text{ lin} = G[2(Vgs - Vt)]Vds$$

where G is the amplification factor given by $G = G'(W/L)$ and $$G' = \sigma\epsilon/qNs(K+1)D$$

The linear drain current occurs when Vds is much less than Vgs−Vt. The saturation current is found by the following expression.

$$Ids\text{ sat} = G(Vgs - Vt)^2$$

The term (Vgs−Vt) is the change in the gate to source voltage above the gate to source threshold voltage; thus (Vgs−Vt) is a measure of how much the device 90 is turned on. The threshold voltage Vt can be positive or negative since it is referenced to the source which will be above the substrate ground. For example, if the source 92 is biased at 5 volts which pinches off the channel 34, and if the channel depletion region 40 reaches all the way to the gate depletion region 38 with the gate 30 unbiased, the channel 34 will begin to conduct when any potential is applied to the gate 30. The absolute threshold voltage will be at a gate to substrate voltage of zero volts but the relative gate to source threshold vt will be $-5$ volts. For a linear device, a threshold voltage of zero volts will occur when the channel depletion region 40 at pinch-off in the P region 32 extends exactly halfway between the gate 30 and channel 34. If it extends less than halfway, the threshold voltage will be positive.

An approximate value for the maximum gate voltage can be obtained by applying a gate voltage that will bring the depletion region to the N side of the channel junction $h_1$, to zero. This can be stated as follows:

$$Vgs\ max = qNs(K+1)D^2/2K\epsilon$$

This approximation ignores the contact potential. Saturation occurs when the drain voltage is high enough to cause the drain end of the channel 34 to pinch off. For the linear device this will occur when the drain to source voltage is greater than the gate to source voltage minus the threshold voltage; thus $$Vds\ sat = (Vgs - Vt).$$

The transconductance of the device is determined by the following two formulas. For the linear region $$gm\ lin = 2GVds$$

and for the saturation region $$gm\ sat = 2G(Vgs - Vt).$$

The gain term of the device can be written as $$G = \left(\frac{W}{L}\right)\left(\frac{\mu_c K\epsilon}{(K+1)D}\right)$$

where $\mu_c$ is the channel mobility.

While the linear embodiment of the invention can have a gain equal to or greater than conventional MOS devices, the quadratic embodiment will have a greater gain than the linear device.

The drain current for the quadratic device can be expressed as $$Ids = \frac{\sigma W}{L}\left[(H + 2BD)Vds - \frac{4}{3}\sqrt{\frac{2A\epsilon}{qNs}}\left[(Vds - Vgs) + \right.\right.$$

-continued $$\left.\left. \frac{CBD^2 qNs}{2A\epsilon}\right]^{3/2} - \left(-Vgs + \frac{CB(D^2)qNs}{2A\epsilon}\right)^{-3/2}\right]$$

where
 $A = (Kg/(Kc(Kg - Kc))$
 $B = (Kg + 1)/(Kg - Kc)$
 $C = (1/Kc) + B)$

The threshold voltage for the quadratic device can be expressed as $$Vt = -\frac{qNs}{2A\epsilon}\left[\left(\frac{H}{2} + BD\right)^2 - CBD^2\right]$$

The maximum voltage that can be applied to the quadratic device is determined in the same way as for the linear device; thus $$Vgs\ max = qNs/2A\epsilon(C-B)BD^2.$$

The quadratic device also has a linear and saturation region of drain current. The linear region again occurs when Vds is much less than Vgs$-$Vt and can be expressed as $$Ids\ lin = \frac{\sigma W}{L}\left[(H + 2BD) - \frac{4}{3}\frac{2A\epsilon}{qNs}\left[\left(\frac{2A\epsilon Vgs}{qNs}\right)^2\right] - \right.$$

$$\left. 6\left[\frac{2A\epsilon}{qNs}(CBD^2 - Vgs) + 3(CBD^2)\right]^{\frac{1}{2}}\right]Vds$$

In the saturation region, again with Vds greater than Vgs$-$Vt, the drain current can be expressed as $$Ids\ sat = \frac{\sigma W}{L}\left[(H + 2BD)(Vgs - V_t) - \right.$$

$$\frac{4}{3}\sqrt{\frac{2A\epsilon}{qNs}}\left[\left(-Vt + \frac{qNs}{2A\epsilon}CBD^2\right)^{3/2} - \right.$$

$$\left.\left.\left(Vgs + \frac{qNs}{2A\epsilon}CBD^2\right)^{3/2}\right]\right]$$

The quadratic transconductances are $$gm\ lin = \frac{\frac{8\sigma W}{3L}\left[\left(\frac{2A\epsilon}{qNs}\right)^2 Vgs - 3\left(\frac{2A\epsilon}{qNs}\right)CBD^2\right]}{\left[\left(\frac{2A\epsilon}{qNs}\right)\right]\left(\frac{2A\epsilon Vgs}{qNs}\right)^2 - 6\left[\frac{2A\epsilon}{qNs}(CBD^2 Vgs)\right] + 3(CBD)^2\right]^{\frac{1}{2}}}$$

and $$gm\ sat = \frac{\sigma W}{L}\left[(H+2BD) - 2\left[\frac{2A\epsilon}{qNs}\left(-Vgs + \frac{qNs}{2A\epsilon}CBD^2\right)\right]^{\frac{1}{2}}\right]$$

AC Characteristics

Figure 16:
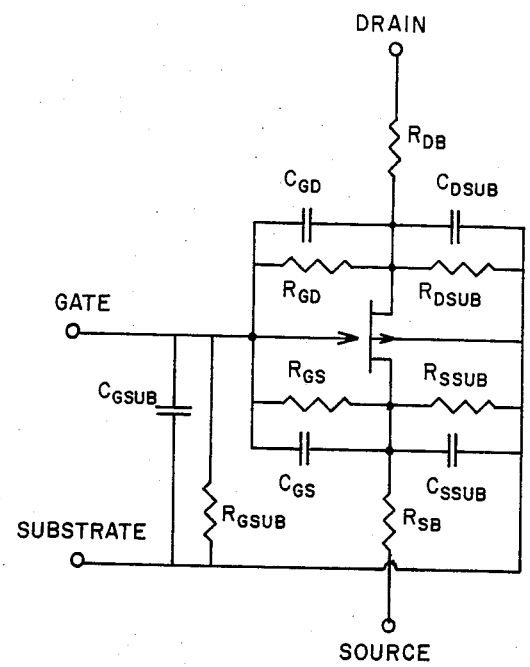
FIG. 16 shows the AC equivalent circuit of a junction field-effect transistor controlled by merged depletion regions and charge balance depletion region width control.

The complete AC equivalent circuit, shown in FIG. 16, can be greatly simplified for most applications. It depicts a new symbol which has been developed to convey the operation of the device. The symbol is similar to the conventional symbol for the JFET but with the gate 30 arrow separated from the channel 34 while a second arrow coming from the back of the channel represents the substrate 32. As shown in FIG. 16, the symbol represents an N-channel device. It is anticipated that for a P-channel device the arrows would be reversed.

The gate capacitance of the device was determined in the section on merged depletion regions and is $$C = (K/K+1)(\epsilon/D)X\ \text{Area}$$

for the linear device. If K is equal to one, the gain term of the device is the same as the gain term of an MOS transistor with the gate capacitance being formed by a dielectric made up of the depletion region with width D.

For the quadratic device the gate capacitance can be stated as $$C = KcA\epsilon\left[\left[\frac{2\epsilon(-Vgs)}{qNs}\right] + CBD^2\right]^{-\frac{1}{2}} \times \text{Area}$$

Since the gate area will equal the channel area, the cut-off frequency of the linear device can be stated as $$F_o lin = \frac{gm}{4\pi Cg} = \frac{(Vgs - Vt)}{2\pi qL^2 KNs}$$

For the quadratic embodiment of the invention the maximum cut-off frequency will be twice that of the linear device. In fact, the cut-off frequency of both devices is so high that in practice it will be the transit time of the carriers through the channel which will determine the highest frequency of operation. Since the transit time is a function of the channel length and maximum carrier velocity, both devices will have the same cut-off frequency. Because a vertical device with sub-micrometer channel lengths can be constructed, these devices should have higher cut-off frequencies than other devices.

Temperature Characteristics

A junction field-effect transistor is inherently stable with temperature. The junction field-effect device controlled by merged depletion regions will have the same channel resistivity characteristics as that of a conventional JFET with similar doping but the variation of threshold voltage with temperature will be much less for the merged-depletion devices since the threshold voltage variations are due to the change in contact potential with temperature. For the linear device there will be no change in threshold voltage with temperature since the change in the two contact potentials of the gate and channel junctions 22, 24 will be equal and thus will cancel. For the quadratic device the two contact potentials will be different but it will be the difference in the change in contact potentials that will alter the threshold voltage, thus the quadratic devices' temperature characteristics will be much better than those of a standard JFET.

Noise

Thermal noise generated in the channel 34 should be less than that of a conventional JFET since the shorter channel length increases the transconductance which lowers the channel noise resistance. Because the device can be constructed with a short channel, and since noise components are a linear function of the channel length, a low voltage device should have almost an order of magnitude improvement over the current JFET devices. Since the JFET has lower noise than MOS or bipolar devices, the MFET will have better performance over these other devices.

Those skilled in the art will immediately recognize that semiconductor devices of the present invention can assume many varied embodiments, other than those specifically disclosed herein, without departing from the spirit of the invention. The invention will have many uses both as a discrete device and particularly in integrated circuitry. It should be understood that any such modifications and variations that may be resorted to are considered to be within the purview and scope of the present invention, and it is intended by the appended claims to cover all such variations and modifications as fall within the true spirit and scope of the invention.

I claim as my invention:

1. A semiconductor device comprising:
   a region of semiconductor material of a first conductivity type forming a substrate region through which no current flows when the device is operating;
   a control region and a controlled region of semiconductor material of a second conductivity type opposite to that of the substrate material forming junctions with the substrate material positioned so that the substrate region between the junctions is sufficiently narrow to permit the depletion regions of the junctions to merge in the substrate under suitable bias; and
   biasing means for applying a reverse bias to each of the junctions wherein a reverse bias is applied to the junctions with respect to the substrate so that the depletion regions merge in the substrate but do not punch through so that the control region controls the controlled region by means of the merged depletion regions.

2. The semiconductor device of claim 1 wherein the substrate region of semiconductor material of a first conductivity type is N type semiconductor material and wherein the regions of semiconductor material of a second conductivity type are P type semiconductor material.

3. The semiconductor device of claim 1 wherein the substrate region of semiconductor material of a first conductivity type is P type semiconductor material and wherein the regions of semiconductor material of a second conductivity type are N type semiconductor material.

4. The semiconductor device of claim 1 wherein the substrate region of semiconductor material of a first conductivity type surrounds at least one of the regions of semiconductor material of a second conductivity type.

5. The semiconductor device of claim 1 wherein the substrate region of semiconductor material of a first conductivity type surrounds all regions of semiconductor material of the second conductivity type.

6. The semiconductor device of claim 1 wherein all regions of semiconductor material are equally doped with impurity concentrations.

7. The semiconductor device of claim 1 wherein the substrate region of semiconductor material of a first conductivity type is more lightly doped with impurity concentrations than the regions of semiconductor material of a second conductivity type.

8. The semiconductor device of claim 1 wherein at least one of the regions of semiconductor material of a second conductivity type is more heavily doped with impurity concentrations than the substrate region of semiconductor material of a first conductivity type.

9. The semiconductor device of claim 1 wherein all regions of semiconductor material of a second conductivity type are equally doped with impurity concentrations.

10. The semiconductor device of claim 1 wherein the impurity concentration of the region of semiconductor material of the first conductivity type is produced by diffusion and wherein the diffusion profile is non-uniform.

11. The semiconductor device of claim 1 wherein the impurity concentration of at least one region of semiconductor material of the second conductivity type is produced by diffusion and wherein the diffusion profile is non-uniform.

12. A method of operating a semiconductor device having a region of semiconductor material of a first conductivity type forming a substrate through which no current flows when the device is operating, and at least two separate regions of semiconductor material of a second conductivity type opposite to that of the substrate material each forming a junction with the substrate material, one of said two separate regions being a control region and the other a controlled region, and wherein the substrate between the junctions is sufficiently narrow to permit the depletion regions of the junctions in the substrate to merge under suitable bias comprising the step of:
applying a reverse bias with respect to the substrate to the junctions so that the depletion regions associated with those junctions merge in the substrate without punch through so that the control region can control the controlled region by means of the merged depletion regions.

13. The method of claim 12 wherein the bias is applied to the junctions to isolate the regions of semiconductor material of the second conductivity type from the substrate by the merged depletion regions.

14. The method of claim 12 wherein the bias is applied to the junctions to isolate the regions of semiconductor material of the second conductivity type from each other by the merged depletion regions.

15. The method of claim 12 wherein the bias is applied to the junctions to isolate the depletion regions from large net current flow by limiting the number of carriers available to produce large net currents in the depletion regions.

16. The method of claim 12 wherein the bias is applied to one of the junctions to control the degree of coupling between the junctions by varying the amount of bias applied to one of the regions of second conductivity type material with respect to the substrate.

17. The method of claim 16 wherein the bias is applied to one of the junctions to uncouple the regions of semiconductor material of the second conductivity type by reducing the applied bias so that the depletion regions no longer merge.

18. The method of claim 13 wherein the bias is applied to the junctions to limit the amount of current and degree of coupling between the junctions to leakage current with the merged depletion regions.

19. The method of claim 12 further comprising the step of
controlling the potential in the merged depletion region by controlling the applied bias.

20. The method of claim 12 further comprising the step of
varying the potential in the merged depletion region by varying the applied bias.

21. The method of claim 12 further comprising the step of
controlling the potential in the depletion region on one side of one of the junctions by controlling the bias applied to the other junction.

22. The method of claim 12 further comprising the step of
adjusting the width of the depletion regions on the merged side of one of the junctions by adjusting the bias applied to either of the junctions.

23. The method of claim 12 further comprising the step of
controlling the width of the depletion region in one of the regions of semiconductor material of the second conductivity type by adjusting the bias to the other junction.

24. The method of claim 12 further comprising the step of
adjusting the applied biases to create a component of the electric field in the merged depletion region parallel to the sides of the junctions whose depletion regions have merged.

25. The method of claim 12 wherein a reverse bias is applied to a first junction and a second junction and further comprising the step of
controlling the point of reversal of the electric field between the junctions in the merged depletion region by adjusting the applied bias to each of the junctions.

26. The method of claim 25 wherein the point of the reversal of the electric field is moved toward the first junction by reducing the applied bias to the first junction.

27. The method of claim 25 wherein the point of reversal of the electric field is moved away from the first junction by increasing the applied bias to the first junction.

28. The method of claim 25 wherein the point of reversal of the electric field is moved toward the first junction by increasing the applied bias to the second junction.

29. The method of claim 25 wherein the point of reversal of the electric field is moved toward the second junction by decreasing the applied bias to the second junction.

30. The method of claim 25 wherein the point of reversal of the electric field is moved away from the second junction by increasing the applied bias to the second junction.

31. The method of claim 25 wherein the point of reversal of the electric field is moved toward one of the junctions by decreasing the applied bias to that junction.

32. The method of claim 25 wherein the point of reversal of the electric field is moved away from one of the junctions by increasing the applied bias to that junction.

33. The method of claim 25 wherein the magnitude of the electric field is adjusted by adjusting the applied bias to either one of the junctions.

34. The metod of claim 12 further comprising the step of
controlling the capacitance of at least one of the junctions by controlling the bias applied to the other junction.

35. The method of claim 34 wherein the capacitance of one of the junctions is reduced by increasing the applied bias to the other junction.

36. The method of claim 34 wherein the capacitance of one of the junctions is increased by reducing the applied bias to the other junction.

37. The method of claim 12 wherein a reverse bias is applied to a plurality of the junctions and wherein the capacitance of the junctions are controlled by controlling the biases applied to any of the junctions.

38. The method of claim 12 wherein the capacitive coupling between the junctions is altered by varying the applied bias to one of the junctions.

39. The method of claim 38 wherein the capacitive coupling is increased by increasing the applied bias to one of the junctions.

40. The method of claim 38 wherein the capacitive coupling is decreased by decreasing the applied bias to one of the junctions.

41. The method of claim 12 wherein the semiconductor device further comprises means for generating hole-electron pairs in the depletion regions and
wherein the method further comprises the step of controlling the collection of carriers by controlling the point of reversal of the electric field.

42. The method of claim 41 wherein the applied bias to one of the junctions is varied to control the collection of carriers by the other junction.

43. The method of claim 12 wherein a reverse bias is applied to each of the junctions so that the depletion region in the substrate associated with each junction can be merged with other depletion regions in the substrate.

44. A method for operating a semiconductor junction device having at least two junctions with a common substrate therebetween through which substrate no current flows when the device is operating comprising the step of:
merging the depletion region associated with each junction in the substrate so that one of the depletion regions on the side of one of the junctions not in the substrate is altered in accordance with changes in the depletion region in the substrate of the other junction.

45. A semiconductor device comprising:
a region of semiconductor material of a first conductivity type;
a region of semiconductor material of a second conductivity type opposite to that of the first forming a junction with the region of semiconductor material of the first conductivity type through which junction no current flows when the device is operating;
bias means applied across the junction to reverse bias the junction for establishing a depletion region on each side of the junction; and
means, other than the biasing means, for controlling the width of the depletion region on one side of the junction only so that the width of the depletion region on the other side of the junction is altered in proportion to the amount of control applied to the depletion region on the controlled side of the junction.

46. The semiconductor device of claim 45 further comprising a second region of semiconductor material of the second conductivity type forming a second junction with the region of semiconductor material of the first conductivity type through which second junction no current flows when the device is operating and positioned relative to the region of semiconductor material of the first conductivity type so that depletion region associated with the second junction which extends into the region of semiconductor material of the first conductivity type can be merged with the depletion region associated with the first junction in the semiconductor material of the first conductivity type and wherein the means for controlling the width of the depletion region comprises means for applying a reverse bias to the second junction so that the depletion region of that junction merges with the depletion region associated with the first junction.

47. The semiconductor of claim 45 wherein the means for controlling the width of the depletion region on one side of the junction comprises means for imposing an electric field parallel to the edge of the junction and perpendicular to the electric field of the depletion region.

48. The semiconductor device of claim 47 wherein the means for imposing an electric field parallel to the edge of the junction comprises a surface contact within the depletion region.

49. The semiconductor device of claim 47 wherein the means for imposing an electric field parallel to the edge of the junction comprises an MOS capacitor adjacent to the semiconductor material having the controlled depletion region.

50. The semiconductor device of claim 45 wherein the means for controlling the width of the depletion region comprises means for controlling the potential applied to the controlled side of the junction.

51. The semiconductor device of claim 50 wherein the means for controlling the potential on one side of the junction comprises means for producing an IR potential drop parallel to the edge of the junction.

52. The semiconductor device of claim 45 wherein the means for controlling the width of the depletion region on one side of the junction comprises an MOS capacitor constructed to alter the ratio of majority carriers in the depletion region.

53. A junction field-effect device comprising:
a channel region through which current flows having a spaced source electrode and drain electrode all of a first conductivity type;
a substrate through which no current flows of a conductivity type opposite to the channel, a portion of which contacts the channel forming a first junction; and a gate electrode of the same conductivity type as the channel which contacts the substrate forming a second junction and positioned relative to the channel so that when both junctions are reverse biased the depletion region associated with each junction can be merged in the substrate.

54. The junction field-effect device of claim 53 wherein the channel and gate are formed of N-type semiconductor material and the substrate is formed of P-type semiconductor material.

55. The junction field-effect device of claim 53 wherein the channel and gate are formed of P-type semiconductor material and the substrate is formed of N-type semiconductor material.

56. The junction field-effect device of claim 53 wherein the impurity concentration of the channel and the gate are equal.

57. The junction field-effect device of claim 53 wherein the impurity concentration of the channel and gate is greater than the impurity concentration of the substrate.

58. The junction field-effect device of claim 53 wherein the impurity concentration of the channel, substrate and gate are equal.

59. The junction field-effect device of claim 53 wherein the impurity concentration of the channel and the substrate are equal.

60. The junction field-effect device of claim 53 wherein the substrate is more lightly doped with impurity concentration than the gate.

61. The junction field-effect device of claim 53 wherein the channel is more lightly doped with impurity concentration than the gate.

62. The junction field-effect device of claim 53 wherein the gate is more lightly doped with impurity concentration than the channel.

63. The junction field-effect device of claim 53 wherein the impurity concentration of the substrate is produced by diffusion and wherein the substrate has a diffusion profile wherein the center of the substrate is more lightly doped with impurity concentration than those portions away from the center of the substrate.

64. The junction field-effect device of claim 53 wherein the impurity concentration of the channel is produced by diffusion and wherein the channel has a diffusion profile wherein the center of the channel is more lightly doped with impurity concentration than those portions away from the center of the channel.

65. The junction field-effect device of claim 53 wherein the impurity concentration of the gate is produced by diffusion and wherein the gate has a diffusion profile wherein the center of the gate is more lightly doped with impurity concentration than those portions away from the center of the gate.

66. A semiconductor device having a plurality of regions for use to control current in an electronic circuit in which controlled currents flow characterized in that at least one of said regions is a substrate through which no controlled current flows and all regions other than the substrate are of the same conductivity type material.

67. A semiconductor device having a plurality of regions for use to control current in an electronic circuit in which controlled currents flow characterized in that at least one of said regions is a substrate of one type conductivity material through which no controlled current flows and all regions other than the substrate are of a conductivity type material different than that of the substrate.

68. The semiconductor device of claim 67 wherein the substrate is formed of intrinsic semiconductor material.

69. The semiconductor device of claim 67 wherein at least one of the regions other than the substrate is formed of intrinsic semiconductor material.

70. The semiconductor device of claim 67 wherein there are at least two regions other than the substrate and wherein at least one of the two regions other than the substrate is formed of a semiconductor material different than that of the other.

71. A field-effect semiconductor device having a source contact and a drain contact interconnected by a conducting channel region and a gate contact positioned relative to the channel to control conductance of the channel but separated from the channel region by a substrate region characterized in that the source, drain, channel and gate are all of the same conductivity type material and the substrate is of a different conductivity type material.

72. A junction field-effect transistor having a conducting channel region and a gate contact to control operation of the channel and an intervening substrate region forming junctions between the channel and substrate and gate and substrate with associated depletion regions characterized in that the channel operation is controlled by the gate by merging the depletion regions in the substrate.

73. A semiconductor device comprising:
a first substrate region through which no current flows when the device is operating formed of a semiconductor material of a first conductivity type;
a plurality of second regions formed of a semiconductor material of a conductivity type opposite that of the substrate, each region separated from the other second regions by the substrate and contacting the substrate to form separate junctions and associated depletion regions and positioned so that the depletion regions associated with each junction can be formed and made to merge in the substrate without punch-through whereby the depletion regions in at least one of said second regions can be controlled by another of the second regions using the merged depletion regions in the substrate.

74. The semiconductor device of claim 73 wherein at least one of said plurality of semiconductor regions of a second conductivity type is a channel region with source and drain electrode regions through which current flows and at least one other of the plurality of regions of the second conductivity type is a gate electrode region positioned relative to the channel to control its conductance but separated from the channel by the substrate.

75. The semiconductor device of claim 73 wherein the second regions of semiconductor material of a conductivity type opposite to that of the substrate are arranged to operate as two discrete devices, each device having a gate electrode region and a channel region with source and drain electrode regions and wherein the drain of one of the discrete devices is positioned to operate as the gate electrode region of the other discrete device.

76. The semiconductor device of claim 73 wherein the plurality of second regions formed of a semiconductor material of a conductivity type opposite to that of the substrate are arranged to operate as two discrete devices, each device having a channel region, and a gate contact region and wherein the channel of one device is positioned to operate as the gate for the other device.

77. The semiconductor device of claim 73 further comprising:
   a second substrate region through which no current flows when the device is operating formed of a conductivity type material different than the first substrate;
   a plurality of third regions formed of a semiconductor type material opposite to the second substrate, each third region separated from the other third regions by the second substrate and contacting the second substrate to form separate junctions and associated depletion regions and positioned so that the depletion regions associated with each junction between the second substrate and each third region can be formed and made to merge in the second substrate without punch-through whereby the depletion region in at least one of the third regions can be controlled by another of the third regions using the merged depletion regions in the second substrate;
   means for isolating the first substrate from the second substrate; and
   means for interconnecting the regions of semiconductor material formed in the first and second substrates so that complimentary semiconductor devices can be constructed.

78. The semiconductor device of claim 73 further comprising biasing means for reverse biasing each junction with respect to the substrate so that depletion regions associated with the junctions merge in the substrate.

79. The semiconductor device of claim 73 wherein said plurality of regions formed of a semiconductor material of a conductivity type opposite that of the substrate comprises a plurality of gate regions and at least one channel region.

80. The semiconductor device of claim 73 wherein said plurality of regions formed of a semiconductor material of a conductivity opposite that of the substrate comprises a plurality of channel regions and at least one gate region.

81. The semiconductor device of claim 73 further comprising means for applying a control voltage to at least one of said second regions of semiconductor material of a type opposite to that of the substrate.

82. The semiconductor device of claim 73 wherein one of said second regions of a semiconductor material of a conductivity type opposite to that of the substrate is a channel and wherein at least two other of the regions formed of a semiconductor material of a conductivity type opposite to that of the substrate are gate regions.

83. The semiconductor device of claim 82 further comprising biasing means for applying a reverse bias to the channel with respect to the substrate so that the channel is normally pinched off whereby the semiconductor device can be operated in the enhancement mode.

84. The semiconductor device of claim 83 wherein the gate regions are positioned on opposite sides of the channel region and further comprising means for applying a control voltage to the gate regions so that when a control voltage is applied to either gate region the channel is opened whereby the semiconductor device performs an OR function.

85. The semiconductor device of claim 83 wherein the gate regions are positioned at right angles to each other and further comprising means for applying a control voltage to each gate so that both gates function to open the channel and so that a control voltage must be applied to both gates to open the channel whereby the semiconductor device performs an AND function.

86. The semiconductor device of claim 82 wherein said plurality of second regions of semiconductor material of a type opposite to that of the substrate are arranged horizontally adjacent each other but separated by the substrate so that the semiconductor device orientation is vertical with respect to the current flow through the channel.

87. The semiconductor device of claim 82 wherein the plurality of regions of conductivity type opposite to the substrate are arranged vertically adjacent each other but separated by the substrate so that the semiconductor device orinetation is horizontal with respect to current flow through the channel.

88. The semiconductor device of claim 73 wherein the second regions of semiconductor material of a conductivity type opposite to the substrate are arranged in the substrate in multiple layers to produce a three dimensional semiconductor device.

89. The semiconductor device of claim 73 wherein the plurality of second regions of a conductivity type opposite to that of the substrate are arranged in the substrate to produce integrated circuitry.

90. In a method of manufacturing a junction field-effect device having at least one channel region through which current is to flow and at least one gate region positioned relative to the channel to control current flow through the channel, both the channel and the gate being doped with impurity contrations, the improvement comprising:
   doping both the gate and channel with the same type of impurity material so that they are of the same conductivity type material;
   providing an intermediate substrate semiconductor region between the gate region and channel region forming a junction with each; and
   doping the intermediate substrate region with an impurity concentration so that it is the opposite conductivity type material.

91. The method of claim 90 wherein the step of doping the substrate comprises:
   doping the substrate with impurity concentration so that depletion regions in the substrate caused by bias applied to one of the junctions can be merged with the depletion region in the substrate associated with the second junction.

92. The method of claim 90 wherein the improvement comprises:
   doping the gate and the channel region to the same impurity concentration as the substrate so that all regions have equal doping.

93. The method of claim 90 wherein the improvement comprises:
   doping the channel and gate with an impurity concentration which is greater than the impurity concentration of the substrate.

94. The method of claim 90 wherein the improvement comprises:
   doping the channel to the same impurity concentration as the substrate.

95. The method of claim 90 wherein the improvement comprises:

doping the chanel and gate with equal amounts of impurity concentration so that the depletion width in the channel is linearally related to the applied voltage to the gate.

96. The method of claim 90 wherein the improvement comprises:
doping the gate with a greater impurity concentration than the substrate.

97. The method of claim 90 wherein the improvement comprises:
doping both the gate and the channel with impurity concentrations wherein the impurity concentration of the gate is greater than the impurity concentration of the channel.

98. The method of claim 90 wherein the improvement comprises:
doping both the channel and gate with impurity concentrations wherein the impurity concentration of the channel is greater than the impurity concentration of the gate.

99. The improvement of claim 90 wherein the doping of the substrate is achieved by diffusion to create a diffusion profile in the substrate wherein the center of the substrate is more lightly doped than portions of the substrate away from the center.

100. The improvement of claim 90 wherein the improvement comprises:
doping one of the regions to a first impurity concentration;
doping a second of the regions to a second impurity concentration so that a doping ratio is established; and
wherein at least one of the operating characteristics of the device is a function of the doping ratio.

101. The method of claim 100 wherein the region which is doped to the first impurity concentration is the gate region and the region which is doped to the second impurity concentration is the substrate region so that a doping ratio is established between the gate region and the substrate region.

102. The method of claim 100 wherein the region which is doped to the first impurity concentration is the channel region and the region which is doped to the second impurity concentration is the substrate region so that a doping ratio is established between the channel region and the substrate region.

103. The method of claim 100 wherein the region which is doped to the first impurity concentration is the gate region and the region which is doped to the second impurity concentration is the channel region so that a doping ratio is established between the gate region and the channel region.

104. The improvement of claim 90 wherein at least one of the doping steps comprises:
applying a dopant for diffusion to the gate region; and
diffusing the dopant into the gate region to create a nonuniform doping profile so that at least one of the operating characteristics of the device is a function of the doping profile.

105. The improvement of claim 90 wherein at least one of the doping steps comprises:
applying a dopant for diffusion to the channel region; and
diffusing the dopant into the channel region to create a nonuniform doping profile so that at least one of the operating characteristics of the device is a function of the doping profile.

106. The improvement of claim 90 wherein at least one of the doping steps comprises:
applying a dopant for diffusion to the substrate region; and
diffusing the dopant into the substrate region to create a nonuniform doping profile so that at least one of the operating characteristics of the device is a function of the doping profile.

107. A semiconductor device comprising:
a first region of first conductivity type;
second and third regions of second conductivity type opposite to said first conductivity type, said second and third regions being separated by said first region, and forming respective first and second PN junctions with said first region;
said first region being sufficiently thin and having sufficiently low doping level that depletion regions formed by reverse biasing said first and second PN junctions can meet within said first region;
a first electrical contact on said first region;
a second electrical contact on said second region;
spaced third and fourth electrical contacts on said third region;
said second region being more heavily doped than said first region.

108. A semiconductor device comprising:
a first region of first conductivity type;
second and third regions of second conductivity type opposite to said first conductivity type, said second and third regions being separated by said first region, and forming respective first and second PN junctions with said first region;
said first region being sufficiently thin and having sufficiently low doping level that depletion regions formed by reverse biasing said first and second PN junctions can meet within said first region;
a first electrical contact on said first region;
a second electrical contact on said second region;
spaced third and fourth electrical contacts on said third region;
means for applying a first, constant voltage between said first electrical contact and said third electrical contact, of a polarity to reverse bias the second PN junction;
means for applying a second voltage between said first electrical contact and said fourth electrical contact, of a polarity to reverse bias said second PN junction;
means for applying a third, signal voltage between said first electrical contact and said second electrical contact;
said third, signal voltage being of varying magnitude, and having at least intermittently a sufficient magnitude in a polarity to reverse bias said first PN junction that the depletion region due to the reverse bias on said first PN junction reaches the depletion region due to the reverse bias applied to said second PN junction by said first and second voltages;
whereby the impedance between said third and fourth electrical contacts is controlled by said third signal voltage.

109. In a semiconductor device having at least two regions of semiconductor material of a first conductivity type and means for electrically contacting the regions so that an external current can flow through one of the regions and an external control voltage can be applied to the other region, the improvement comprising, in combination:

an intermediate layer of semiconductor material of a second conductivity type opposite to that of the first two regions, through which no external current flows, the intermediate layer being positioned between the first two regions to form junctions therewith and the intermediate region between the junctions being sufficiently narrow to permit the depletion regions in the intermediate layer associated with the junctions to merge in the intermediate layer under suitable bias; and means for applying a reverse bias to each of the junctions wherein a reverse bias is applied to the junctions with respect to the intermediate layer so that the depletion regions merge in the intermediate layer whereby the control voltage applied to one of the first two regions affects the impedance of and current flow through the other of the first two regions by means of the merged depletion regions.

110. In a semiconductor device wherein current can flow through a channel region of first conductivity type between source and drain, the improvement which comprises:

a gate region of said first conductivity type separated from said channel by an intermediate region of second conductivity type;

first and second junctions being formed between said intermediate region and said channel region and between said intermediate region and said gate region, first depletion regions having a width extending into said channel and intermediate regions from said first junction, and second depletion regions having a width extending into said gate and intermediate regions from said second junction, said intermediate region being of width and doping to allow merging within said intermediate region of said first and second depletion regions; and bias means for reverse biasing said second junction and for controlling the width of said first depletion region in said channel region.

111. In a semiconductor device, the combination comprising:

first and second PN junctions having approximately parallel portions and having depletion regions associated therewith;

said depletion regions having boundaries displaced from the associated junction as a function of the doping concentrations on either side of said junctions;

said junctions being spaced such that the depletion regions therebetween merge;

reverse bias means connected to the first PN junction for varying the lateral conductivity on the side of the second PN junction remote from said first PN junction.

a third PN junction having depletion regions associated therewith;

said third PN junction being spaced from said first PN junction such that the depletion regions therebetween merge; and wherein said side of second PN junction remote from said first PN junction comprises a first channel; and wherein the side of the third PN junction remote from said first PN junction comprises a second channel.

112. The semiconductor device as set forth in claim 111 wherein said first channel is not parallel to the second channel.

113. The semiconductor device as set forth in claim 112 wherein said first channel is not coplanar with said second channel, thereby providing a three dimensional device.

114. The semiconductor device as set forth in claim 111 wherein the reverse bias means and the currents in said first and second channels provide a logic function.

115. The semiconductor device as set forth in claim 111 wherein the depletion regions between said first and third PN junctions merge with little or no externally applied voltage across either junction.

* * * * *